(12) United States Patent
French

(10) Patent No.: US 10,602,288 B1
(45) Date of Patent: Mar. 24, 2020

(54) SYSTEM AND METHOD FOR COMPENSATING FOR NON-LINEAR BEHAVIOR FOR AN ACOUSTIC TRANSDUCER

(71) Applicant: Harman International Industries, Incorporated, Stamford, CT (US)

(72) Inventor: John Barry French, Port Carling (CA)

(73) Assignee: Harman International Industries, Incorporated, Stamford, CT (US)

(*) Notice: Subject to any disclaimer, the term of this patent is extended or adjusted under 35 U.S.C. 154(b) by 0 days.

(21) Appl. No.: 16/402,805

(22) Filed: May 3, 2019

(51) Int. Cl.
| H04R 3/00 | (2006.01) |
| H04R 9/06 | (2006.01) |
| H04R 29/00 | (2006.01) |
| H04R 9/04 | (2006.01) |
| H03F 3/181 | (2006.01) |
| H04R 1/28 | (2006.01) |
| H03F 1/32 | (2006.01) |

(52) U.S. Cl.
CPC ............ H04R 29/001 (2013.01); H03F 1/32 (2013.01); H03F 3/181 (2013.01); H04R 1/2834 (2013.01); H04R 3/00 (2013.01); H04R 9/043 (2013.01); H04R 9/06 (2013.01); H03F 2200/03 (2013.01)

(58) Field of Classification Search
CPC .......... H04R 3/00; H04R 3/002; H04R 3/007; H04R 41/2834; H04R 9/00; H04R 9/06; H04R 9/043; H04R 29/00; H04R 29/001; H03F 3/181; H03F 3/32; H03F 2200/03; H03G 1/0005; H03G 3/00; H03G 3/004
See application file for complete search history.

(56) References Cited

U.S. PATENT DOCUMENTS

| 5,537,479 A | * | 7/1996 | Kreisel | ..................... H04R 1/02 381/89 |
| 8,761,409 B2 | | 6/2014 | Pfaffinger | |
| 2003/0118193 A1 | * | 6/2003 | Leske | .................. H04R 29/003 381/59 |
| 2005/0031117 A1 | * | 2/2005 | Browning | ........... H04M 1/6016 379/391 |
| 2005/0031139 A1 | * | 2/2005 | Browning | .............. H04R 3/002 381/96 |

(Continued)

FOREIGN PATENT DOCUMENTS

WO 2019060799 A1 3/2019

*Primary Examiner* — Thang V Tran
(74) *Attorney, Agent, or Firm* — Brooks Kushman P.C.

(57) ABSTRACT

In at least one embodiment, an audio amplifier system including a memory and an audio amplifier is provided. The audio amplifier includes the memory and is programmed to receive an audio input signal and to generate a target current signal based on the audio input signal. The audio amplifier is further configured to generate a first predicted position of a voice coil of a loudspeaker and to generate a first corrected current signal based on the target current signal and on the first predicted position of the voice coil. The audio amplifier is further configured to determine a pressure within a loudspeaker enclosure based at least on the first predicted position of the voice coil and determine a position of a passive radiator based at least on the pressure within the loudspeaker enclosure. The audio amplifier is further configured to generate a second predicted position of the voice coil.

20 Claims, 14 Drawing Sheets

(56) References Cited

U.S. PATENT DOCUMENTS

| | | | |
|---|---|---|---|
| 2010/0172516 A1* | 7/2010 | Lastrucci | H04R 3/002 |
| | | | 381/107 |
| 2015/0030167 A1* | 1/2015 | Pan | H04R 3/007 |
| | | | 381/59 |
| 2015/0124982 A1* | 5/2015 | Berthelsen | H04R 29/001 |
| | | | 381/59 |
| 2016/0157035 A1* | 6/2016 | Russell | H04R 7/16 |
| | | | 381/405 |
| 2017/0366899 A1* | 12/2017 | Mendes | H03G 3/004 |
| 2019/0098403 A1* | 3/2019 | Osterneck | H04R 3/007 |
| 2019/0098416 A1 | 3/2019 | French | |
| 2019/0200122 A1* | 6/2019 | Lambert | H04R 3/002 |
| 2019/0222939 A1* | 7/2019 | Brunet | H04R 3/02 |

\* cited by examiner

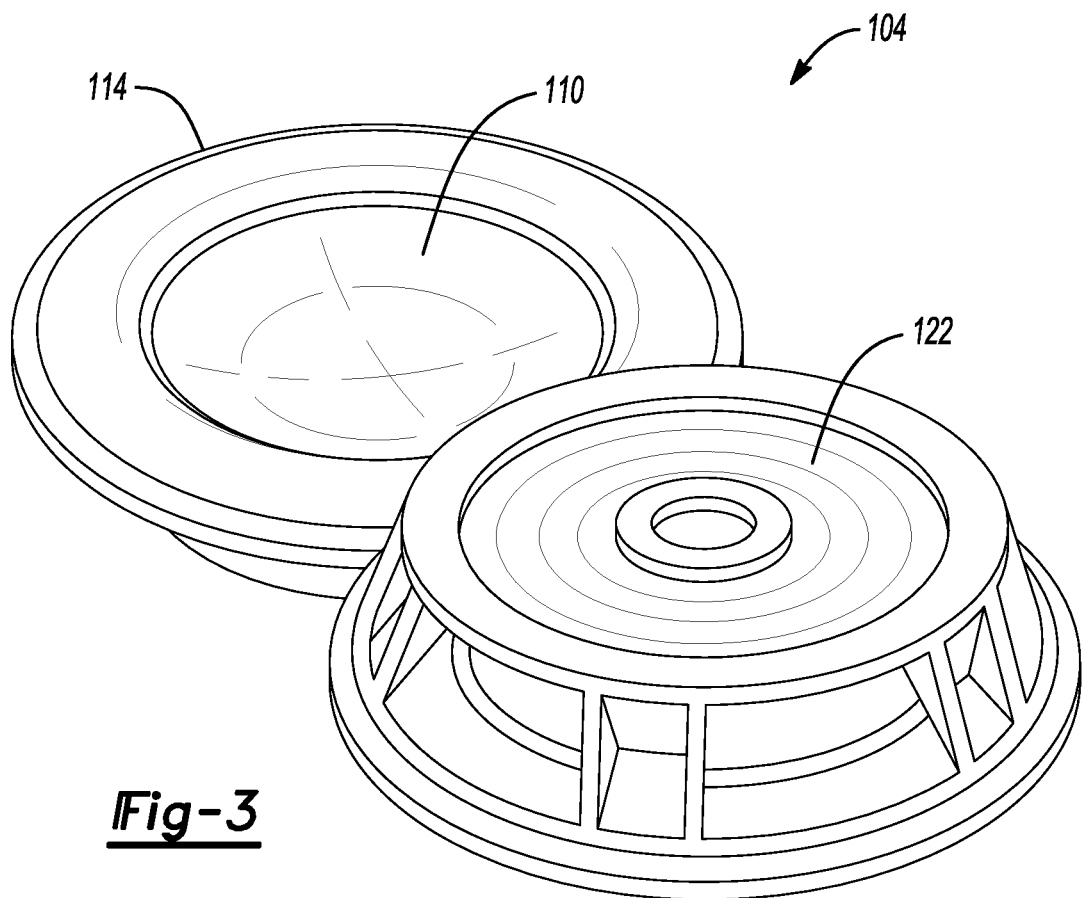
_Fig-3_
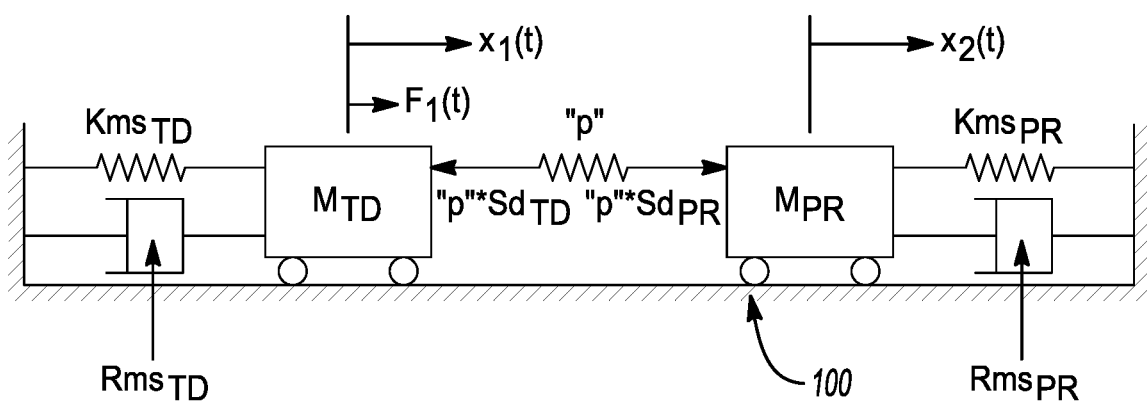
_Fig-4_

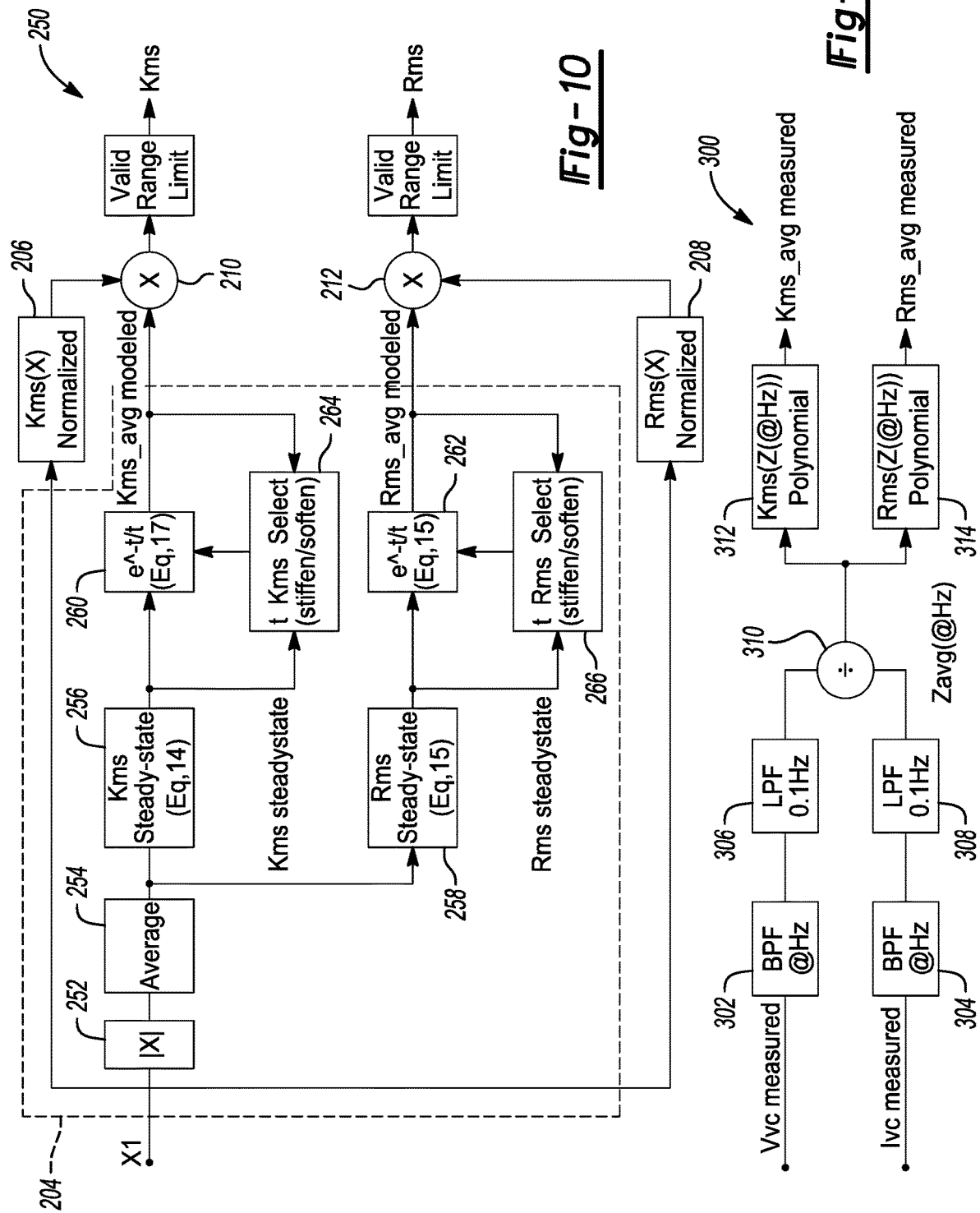

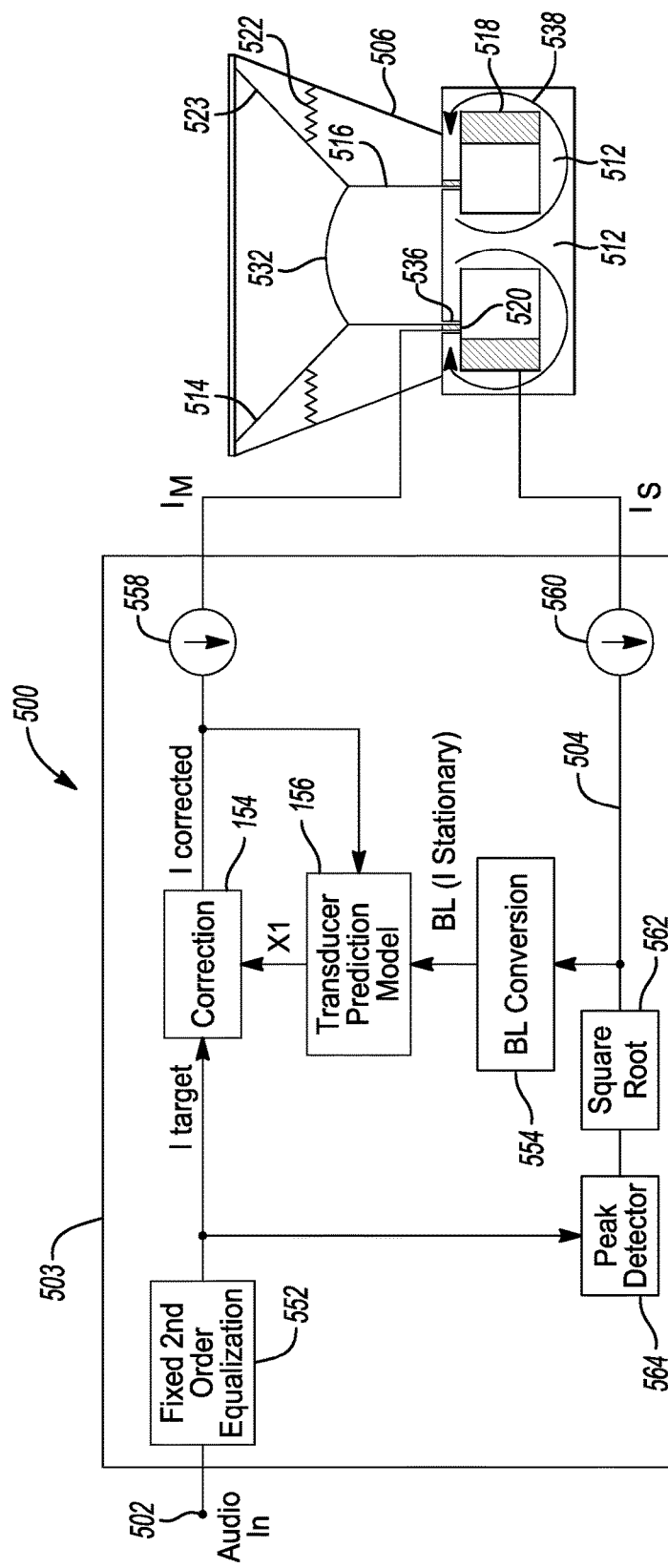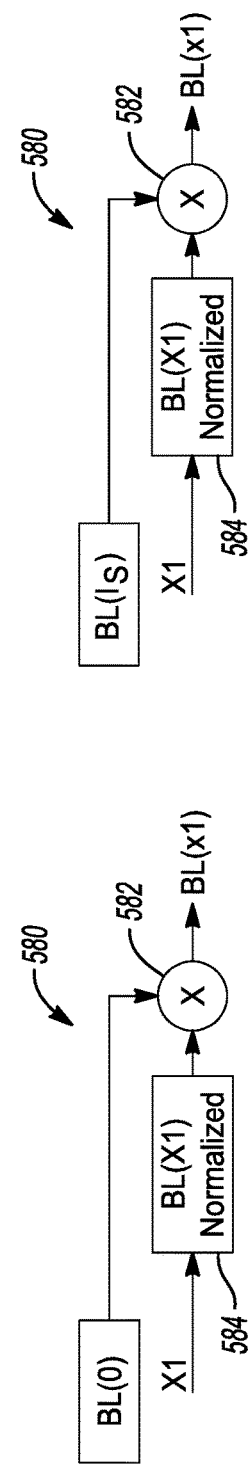
*Fig-14*
*Fig-15*
*Fig-16*

US 10,602,288 B1

SYSTEM AND METHOD FOR COMPENSATING FOR NON-LINEAR BEHAVIOR FOR AN ACOUSTIC TRANSDUCER

CROSS-REFERENCE TO RELATED APPLICATIONS

This application may relate to U.S. application Ser. No. 16/402,566, entitled "SYSTEM AND METHOD FOR NON-LINEAR BEHAVIOR FOR AN ACOUSTIC TRANSDUCER BASED ON MAGNETIC FLUX", and filed on May 3, 2019.

TECHNICAL FIELD

One or more aspects disclosed herein generally a system and method for compensating for non-linear behavior for an acoustic transducer. Aspects disclosed herein may provide an active sensor-less, non-linear correction method and apparatus for loudspeakers using moving coil acoustic transducers, enclosure and passive radiator. For example, a low machine instructions second (MIPS), sensor-less model and algorithm, is provided, for correcting distortion caused by a diaphragm suspension and a voice coil motor, as a function of voice coil position, for closed, vented, and passive radiator designs, driven with current and voltage sources. These aspects and others will be discussed in more detail herein.

BACKGROUND

PCT/US2018/052336 ("the '336 publication") to French provides an acoustic transducer. The acoustic transducer includes a controller configured to receive an input audio signal and to generate a first reference signal indicative of an envelope of the input audio signal. The controller is further configured to provide a stationary coil signal to a stationary coil of an acoustic transducer based on the first reference signal and to measure a current through the stationary coil after providing the stationary coil signal to the stationary coil. The controller is further configured to generate a first output indicative of the current through the stationary coil and to determine a magnetic flux in an air gap of magnetic material based on the first output. The controller is further configured to generate a voltage output for a moving coil that is inversely proportional to the magnetic flux in the air gap. The voltage output provides an undistorted output that corresponds to the input audio signal

SUMMARY

In at least one embodiment, an audio amplifier system including a memory and an audio amplifier is provided. The audio amplifier includes the memory and is programmed to receive an audio input signal and to generate a target current signal based on the audio input signal. The audio amplifier is further configured to generate a first predicted position of a voice coil of a loudspeaker and to generate a first corrected current signal based on the target current signal and on the first predicted position of the voice coil. The audio amplifier is further configured to determine a pressure within a loudspeaker enclosure based at least on the first predicted position of the voice coil and determine a position of a passive radiator based at least on the pressure within the loudspeaker enclosure. The audio amplifier is further configured to generate a second predicted position of the voice coil based on at least the pressure within the loudspeaker, the position of the passive radiator, and a first corrected current signal.

In at least another embodiment, an audio amplifier system including memory and an audio amplifier is provided. The audio amplifier includes the memory and is programmed to receive an audio input signal and to generate a target current signal based on the audio input signal and a velocity of a diaphragm of a transducer. The audio amplifier is further programmed to generate a first corrected current signal based at least on the target current signal and on a first predicted position of a voice coil of a loudspeaker.

In at least another embodiment, a computer-program product embodied in a non-transitory computer read-able medium that is programmed for amplifying an audio input signal is provided. The computer-program product includes instructions for receiving the audio input signal and for generating a target current signal based on the audio input signal. The computer-program product further includes generating a first predicted position of a voice coil of a loudspeaker and generating a first corrected current signal based on the target current signal and the first predicted position of the voice coil. The computer-program product further includes determining a pressure within a loudspeaker enclosure based at least on the first predicted position of the voice coil and determining a position of a passive radiator based at least on the pressure within the loudspeaker enclosure. The computer program product further includes generating a second predicted position of the voice coil based on at least the pressure within the loudspeaker, the position of the passive radiator, and a first corrected current signal.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIG. 3 generally depicts various aspects that comprise the passive radiator;

FIG. 4 generally illustrates a model of elements associated with the transducer and the passive radiator in the loudspeaker system;

FIG. 10 illustrates a system that also executes a model for providing Kms and Rms in accordance to one embodiment;

FIG. 11 depicts one example of apparatus that measures the value of Kms and Rms in accordance to one embodiment;

FIG. 14 generally illustrates one implementation of an acoustic transducer arrangement in accordance to one embodiment;

FIG. 15 generally illustrates one implementation for calculating the magnetic flux density (BL) in accordance to one embodiment;

FIG. 16 generally illustrates another implementation for calculating the magnetic flux density (BL) in accordance to one embodiment;

FIG. 24 generally depicts a method performed by the audio amplifier system in accordance to another embodiment.

DETAILED DESCRIPTION

Figure 1:
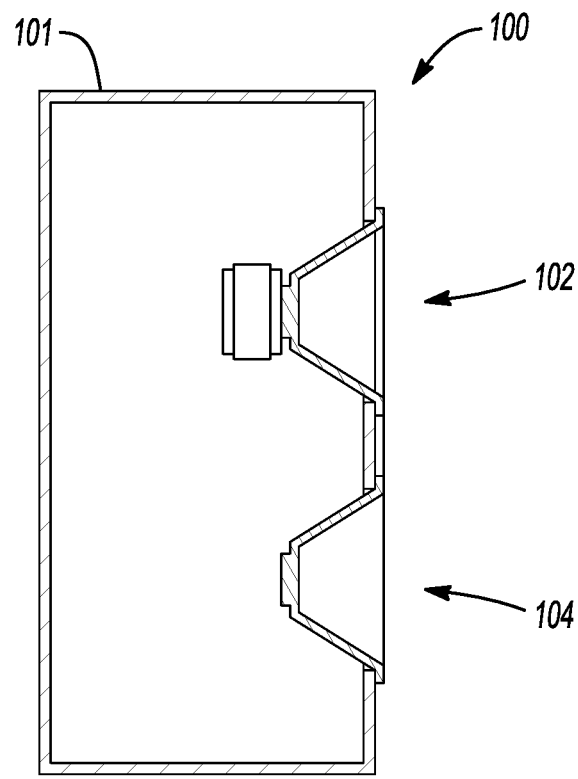
FIG. 1 generally depicts an example of an enclosed loudspeaker system.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

It is recognized that the controllers as disclosed herein may include various microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, such controllers as disclosed utilizes one or more microprocessors to execute a computer-program that is embodied in a non-transitory computer readable medium that is programmed to perform any number of the functions as disclosed. Further, the controller(s) as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware-based inputs and outputs for receiving and transmitting data, respectively from and to other hardware-based devices as discussed herein.

As moving coil transducers (or moving coil loudspeakers) increase their acoustic output, such transducers increase their distortion. This fundamental relationship drives the size, weight, cost, and in-efficiency of the transducer, all of which are undesirable. This may be particularly the case for transducers that are used in automotive applications where all of these performance issues are significant. At the same time, there is an ever-increasing need for higher output, lower distortion, systems that can achieve or provide desired active noise cancellation (ANC), engine order cancellation (EOC), individual sound zones (ISZ), and echo-cancellation for speech recognition.

Consequently, there are sensor-less methods, such as those described by Klippel which, through signal processing, attempt to minimize the distortion of the transducer, which in turn can, if used properly, enable the transducer designer to achieve smaller, lighter, lower cost, or more efficient solutions depending on the desired trade-off. However, these methods may be computationally expensive (e.g., 100 million instructions per second (MIPS) or more)), especially in multi-channel applications such as those found in automotive. Further, these methods often require an embedded micro-controller as well as a digital signal processor (DSP). Thus, there is a need for a low MIPs algorithm (e.g., which provides for comparatively low processing requirements) and low hardware cost method for non-linear distortion correction as provided herein. Moreover, the solutions should be compatible with automotive hardware which require comparatively low processing requirements.

In general, at a fundamental level, once control or correction of the non-linearities in a transducer are actively controlled and or corrected, the transducer and system designers have flexibility with respect to tradeoffs that may be necessary in a loudspeaker. This may improve size, weight, cost, and efficiency depending on the design goals. For example, embodiments disclosed herein may provide better control over the transducer's displacement or excursion and voice coil current which may allow the transducer to be driven closer to its limits and consequently provide more output. In addition, the embodiments disclosed herein provide enhanced control over the transducer's non-linear performance and may enhance the performance of acoustic algorithms which depend on the linearity or response of the transducer, such as ANC, RNC, EOC, ISZ, Echo cancellation, etc.

The embodiments disclosed herein may be: (i) robust and inherently predictable in terms of stability, repeatability, and inspect ability (i.e., not a black box), (ii) computationally simple with low to very low MIPs, sensor-less, (iii) adaptive with simple current sensing, and (iv) a simplification to the algorithm and operate in a DSP environment that may not need an accompanying embedded controller to be adaptive.

FIG. 1 generally depicts an example of an enclosed loudspeaker system 100 in accordance to one embodiment. The system 100 includes an enclosure 101 generally includes a loudspeaker 102 (or transducer) (e.g., an active loudspeaker or main driver) and a passive radiator 104 (or drone cone that does not receive electrical energy in the form an audio input signal). The enclosure 101 generally represents a common loudspeaker enclosure for transmitting audio signals and aspects related to the transducer 102 and the passive radiator 104 will be discussed in more detail hereafter.

Figure 2:
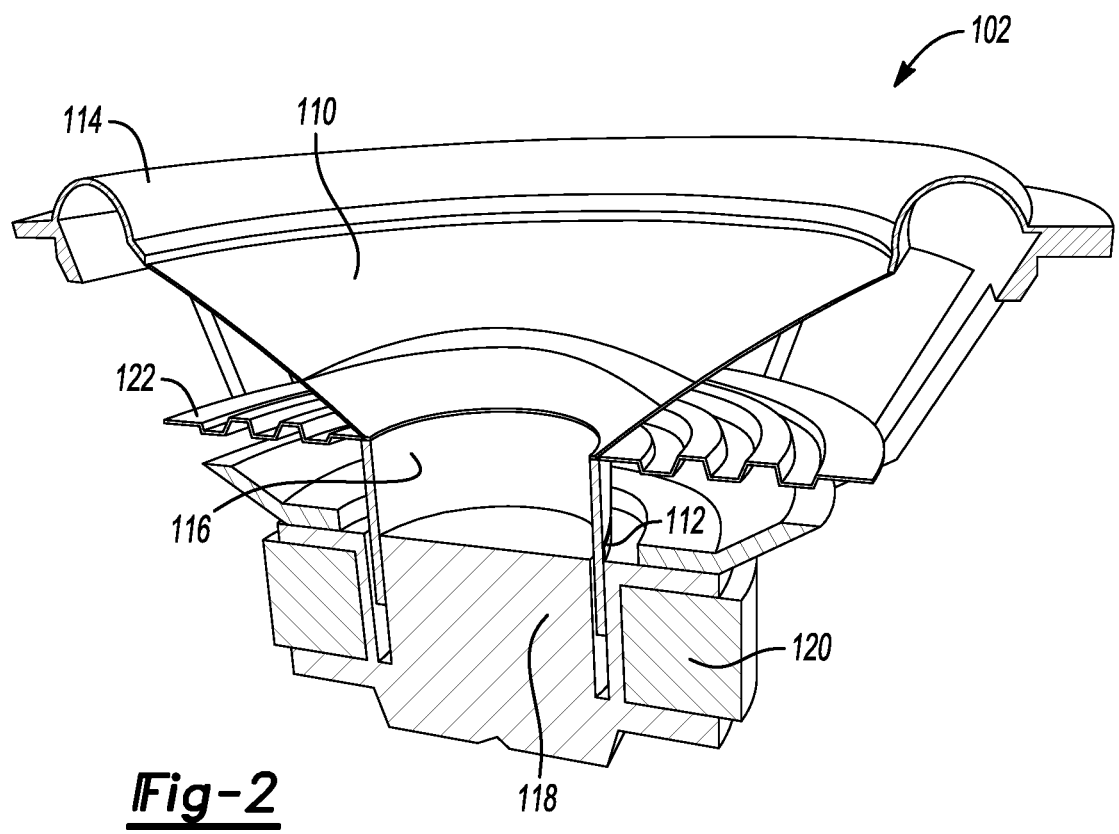
FIG. 2 generally depicts various aspects that comprise a transducer.

FIG. 2 generally depicts various aspects that comprise the transducer 102. For example, the transducer 102 generally includes a cone (or diaphragm) 110 and a voice coil 112. A surround (or suspension) 114 is attached at an end of the diaphragm 110. A former 116 surrounds the voice coil 112 and is positioned within an air gap 118. An outer magnet (or magnet) 120 surrounds the air gap 118 and at least a portion of the voice coil 112 and the former 116. A spider 122 surrounds a portion of the former 116.

In general, an audio input signal corresponding to audio data is provided to the voice coil 112. The voice coil 112 and the magnet 120 are magnetically coupled to one another and the audio input signal causes a linear movement of the diaphragm 110 in a vertical axis based on the polarity of the audio input signal. The diaphragm 110 is generally flexible and undergoes excursion in both directions on the vertical axis in response to the magnetic fields that are transferred between the voice coil 112 and the magnet 120. The former 116 is attached to the diaphragm 110 and undergoes a similar displacement (or movement along the vertical axis) as that of the diaphragm 110. As a result of the linear displacement of the diaphragm 110, the transducer (or loudspeaker) 100 transmits the audio input signal into a room or other environment for consumption by a user. The spider 122 is generally configured to prevent the diaphragm 110 from moving horizontally during the linear displacement of the diaphragm 110 in the vertical direction or axis.

FIG. 3 generally depicts various aspects that comprise the passive radiator 104. In general, the passive radiator 104 may include all of the noted components that comprise the transducer 102 except for the voice coil 112 and the magnet 120. The passive radiator 104 may use sound that is trapped within the enclosure 101 to generate a resonance to provide low frequencies (i.e., bass). The passive radiator 104 may generate a frequency based on a mass and springiness (or compliance) of air within the enclosure 101. The passive radiator 104 may be tuned to the enclosure 101 by varying its overall diaphragm mass (including a weight of the diaphragm 110 or cone). As the transducer 102 generates air pressure due to the linear displacement of the diaphragm 110, such air pressure moves the passive radiator 104.

FIG. 4 illustrates a model of elements associated with the transducer 102 and the passive radiator 104 in the loudspeaker system 100. In general, by mathematically modeling a behavior of the voice coil 112 (or the moving coil of the transducer 102) and the other mechanical elements in the loudspeaker system 100, it is possible to calculate a non-linear behavior and correct for the non-linear behavior using an amplifier and signal processing in real-time. These aspects will be discussed in more detail herein.

There are many ways to model the loudspeaker system. however, if as this case here, there is a good pre-understanding of the physical elements of the system, a model fitted to the elements may be computationally simplest and easiest to tune. Aspects disclosed herein attempt to model the physical elements (e.g., the transducer 102 and the passive radiator 104) and their interaction in the loudspeaker system 100, in a way that can be directly calculated, adaptively tuned, and when the elements behave in a non-linear way, be corrected.

There are generally four sub-systems in the loudspeaker system 100: (1) the transducer 102 (which transduces the electrical signal from an amplifier (not shown) to a mechanical output (not shown)) (e.g., a mechanical output may be considered motion, this in turn transduces a mechanical output to an acoustic signal), (2) the passive radiator 104 (which resonates with the enclosure 101 and the transducer 102 to produce acoustic output at lower frequencies), (3) the enclosure 101 which couples (through pressure) the passive radiator 104 to the transducer 102 and isolates a back pressure for both the passive radiator 104 and transducer 102 from the front pressure, and (4) an amplifier and signal processing (now shown). Two simplified subsets of the loudspeaker system 100 may also be used such as a vented system, which replaces the passive radiator 104 with an acoustic mass that is created using a port in the enclosure 101, and a closed box system which has simply a sealed enclosure without a vent or a passive radiator 104. FIG. 4 illustrates a three mechanical sub-system and is analogous to a two-body resonant system.

In general, the mechanical elements for the transducer 102 can be modeled as a spring with a stiffness (e.g., Kms_TD), a damping (e.g., Rms_TD) and a moving mass (e.g., M_TD). M_TD corresponds to a mass of all of the moving parts including the air coupled to the diaphragm 110. Rms_TD corresponds to frictional losses of the surround 114 and the spider 122 combined. Kms_TD corresponds to the spring stiffness of the surround 114 and the spider 122 combined. In a similar manner, the passive radiator 104 can be modeled as a stiffness (e.g., Kms_PR), a damping (e.g., Rms_PR), and a moving mass (e.g., M_PR). The transducer 102 and the passive radiator 104 may be considered as the two bodies of the system 100. A force coupling the bodies can be modeled by pressure (e.g., relative to an ambient pressure outside of the enclosure 101) in the enclosure 101 times a surface area of the diaphragm 110 of the transducer 102 (e.g., Sd_TD) and diaphragm 110 of the passive radiator 104. The compressibility of the air in the enclosure 101 can be modeled as a spring with a stiffness of kappa "κ" (i.e., the adiabatic index of air, approximately 1.4) multiplied by the box pressure.

In the case of the voice coil 112 (or the moving coil of the transducer 102), a driving force F_1, can be modeled by a strength of a magnetic field in the air gap 118 (e.g., "B") times a length of conductor in the field "L", times the current in the conductor (e.g., the voice coil 112).

$$F_1(t) = B \cdot L \cdot i_{vc}(t) = BL \cdot i \qquad \text{Eq. (1)}$$

A frame of reference $x_1(t)$ is defined for a position of diaphragm 110 of the transducer 102. Similarly, a frame of reference $x_2(t)$ is defined for a position of the diaphragm 110 of the passive radiator 104. A positive direction of $x_1(t)$ is defined as moving into the enclosure 101 and a positive direction of $x_2(t)$ is defined as moving out of the enclosure 101.

Using the relationships that force of a moving mass is mass times acceleration, the force of a spring equals the distance from rest times, the spring stiffness, and the force of friction (or damping) is the velocity times the friction.

It is possible to represent forces on the moving mass of the transducer 102 (e.g., MmsTD) by:

$$B \cdot L \cdot i = M_{TD} \cdot \frac{d^2}{dt^2} x_1 + Kms_{TD} \cdot x_1 + Rms_{TD} \cdot \frac{d^1}{dt^1} x_1 + \kappa \cdot p \cdot Sd_{TD} \qquad \text{Eq. (2)}$$

where $x_1(t)$ is shown as $x_1$.

In a similar way, forces on the moving mass of the passive radiator 104 may be represented by:

$$-\kappa \cdot p \cdot Sd_{PR} = M_{PR} \cdot \frac{d^2}{dt^2}x_2 + Kms_{PR} \cdot x_2 + Rms_{PR} \cdot \frac{d^1}{dt^1}x_2 \quad \text{Eq. (3)}$$

where $x_2(t)$ is shown as $x_2$.

Next, it may be generally necessary to calculate a pressure "p" based on a position of diaphragm 110 of the transducer 102 and of the diaphragm 110 of the passive radiator 104. This may be accomplished by first calculating a change in volume of the enclosure 101 (e.g., Vol_1) which in turn may be a volume of the enclosure 101 (e.g., Vol_0) minus the volume taken by the displacement of diaphragms 110 of the transducer 102 and the passive radiator 104 from a rest position. A volume of air is known to be proportional to the pressure and so:

$$\text{Vol}(x_1, x_2) = \text{Vol}_0 + (S_{D\_TD} \cdot x_1 - S_{D\_PR} \cdot x_2) \quad \text{Eq. (4)}$$

Next by relating the relative pressure in the enclosure "p" to the relative volumes and the pressure outside the enclosure p_amb (for ambient), a new pressure resulting from a change in volume can be calculated by the following:

$$p(x_1, x_2) = \frac{\text{Vol}_0 \cdot p_{amb}}{\text{Vol}(x_1, x_2)} - p_{amb} \quad \text{Eq. (5)}$$

Note that "p" in the free-body force diagram (i.e., in FIG. 4) is p(x1,x2) in Eq. (5).

If Vol_0 is allowed to be the volume of the enclosure 101 with the diaphragms 110 (for both the transducer 102 and the passive radiator 104) at rest, then a change in pressure relative to the ambient pressure may be shown via Eq. 6 as shown below.

By combining the equations (4) and (5) to calculate the pressure in the enclosure 101 relative to ambient as a function of X1 and X2, the following is obtained:

$$p(x_1, x_2) = \frac{p_{amb} \cdot (S_D \cdot x_1 - S_{D\_PR} \cdot x_2)}{\text{Vol}_0 + S_D \cdot x_1 - S_{D\_PR} \cdot x_2} \quad \text{Eq. (6)}$$

This system of ordinary differential equations may then describe the motion of the diaphragms 110 (i.e., of the transducer 102 and the passive radiator 104) given a driving force from the voice coil 112. However, this does not yet account for the non-linear behavior.

Because of the shape of the magnetic field in the vicinity of the voice coil 112, BL is a non-linear function of position X1 of the diaphragm 110 of the loudspeaker 102. There may be several methods to model this aspect, but a simple method could use an $n^{th}$ order polynomial. For example, the following equations could represent BL as a function of position normalized to the rest position times the nominal value at the rest position:

$$BL = (cBL_4 \cdot x^4 + cBL_3 \cdot x^3 + cBL_2 \cdot x^2 + cBL_1 \cdot x + 1) \cdot BL(0) \quad \text{Eq. (7)}$$

While Eq. (7) illustrates a $4^{th}$ order polynomial, it is recognized that an nth order polynomial may be implemented for Eq. (7). Because of the physical attributes of the diaphragm's 110 suspension, Kms and Rms are non-linear functions of the position X1. As with BL, Rms and Kms can be represented as a polynomial. The polynomial has been factored into two sections such as a normalized part and a scalar part at X1=0 that corresponds to the rest position. The benefit of this will become clear in following improvements $$Kms = (cK_4 \cdot x^4 + cK_3 \cdot x^3 + cK_2 \cdot x^2 + cK_1 \cdot x + 1) \cdot Kms(0) \quad \text{Eq. (8)}$$

$$Rms = (cR_4 \cdot x^4 + cR_3 \cdot x^3 + cR_2 \cdot x^2 + cR_1 \cdot x + 1) \cdot Rms(0) \quad \text{Eq. (9)}$$

Figure 5:
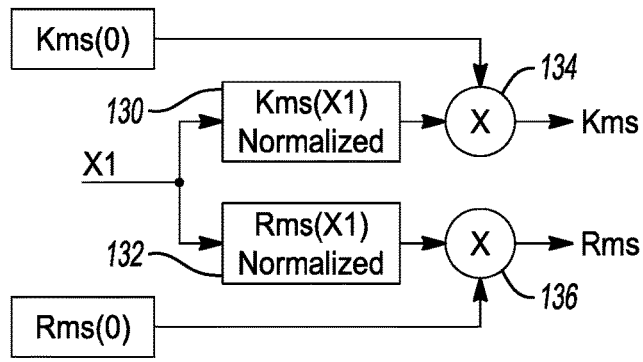
FIG. 5 generally illustrates a system that estimates Kms (x) and Rms (x) in the loudspeaker system in accordance to one embodiment.

Eq. (8) and Eq. (9) can be shown from a signal flow standpoint as illustrated in FIG. 5 via a first normalized circuit 130, a second normalized circuit 132, a first multiplier 134, and a second multiplier 136. It is recognized that $cR_4 \cdot x^4$ and so on as depicted in the parenthesis of Eq. (8) and (9) correspond to the first normalized circuit 130 and the second normalized circuit 132, respectively. Each of the first normalized circuit 130 and the second normalized circuit 132 generally include hardware and software to perform the calculations required by Eqs. (8) and (9).

In the case of Rms, it may also be a function of a velocity of the diaphragm 110, which could also be modeled as a polynomial for example:

$$Rms = (cV_2 \cdot \text{velocity}^2 + cV_1 \cdot \text{velocity} + 1) \cdot Rms(x) \quad \text{Eq. (10)}$$

In Eq. (10), Rms(x) represents Rms of Eq. (9)

These equations can then be solved using a numerical method such as Euler's method, where the equations are iterated with small steps in time (small relative to the rate of change of position of any variable in the system 100). In particular, solving the system of Equations 1-10 will provide the velocity of the diaphragm 110. This will be described in more detail below.

Correction Via a Current Source

Figure 6:
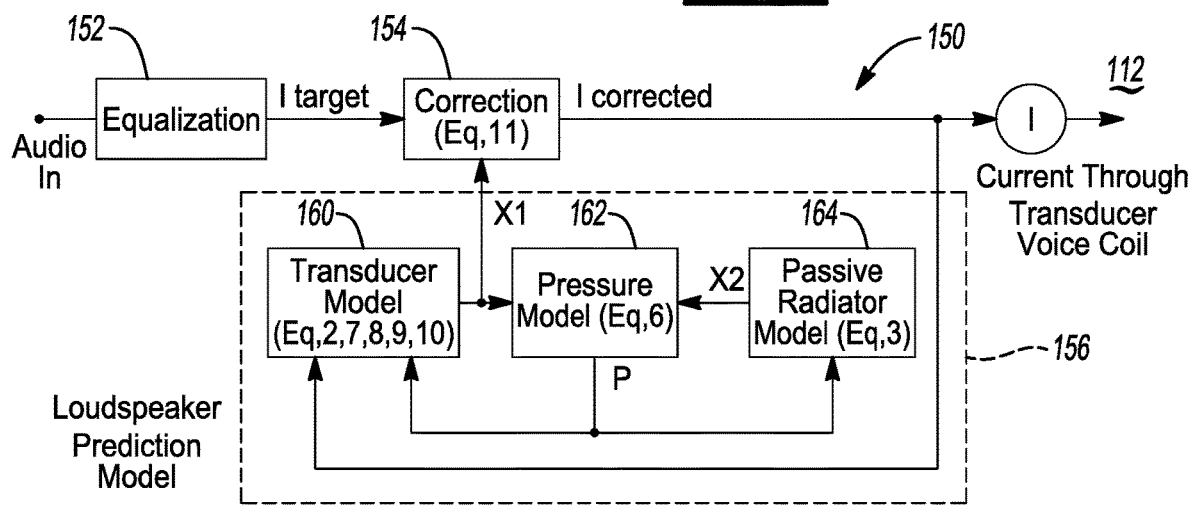
FIG. 6 generally illustrates an amplifier system that corrects distortion in the loudspeaker system in accordance to one embodiment.

Now that a model to estimate the position and velocity of the diaphragm 110 of the transducer 102 and the passive radiator 104 has been established, these aspects may be inserted into a system (or audio amplifier system) 150 to correct the distortion (see FIG. 6). The system 150 may be implemented as a current source amplifier (or audio amplifier) and generally includes an equalization block 152, a core correction block 154, a transducer prediction model block 156. The computationally simplest approach is to use the current source 158 to drive the voice coil 112. By nature of the current source 158, the system 150 eliminates the effect of the resistance in the voice coil 112 and inductance on the current and thus may be negated. The current source 158, by definition, feeds the desired current regardless of the load. In this approach, it may only be necessary to determine a corrected current for the voice coil 112.

The equalization block 152 generates a current target (or I_target) that corresponds to a desired current based on the audio input signal. The transducer model block 160 is generally fed an input current I_vc (or I corrected) which represents the current of the voice coil 112 produced by the amplifier 150 in response to at least the target current (i.e., I_target). The transducer prediction model block 156 includes a combination of hardware and software and calculates, per equations, 2, 3, 6, 7, 8, 9, and 10, the position X1 of the diaphragm 110 of the loudspeaker 102 (or the predicted positions of the voice coil 112). The system 150 provides I corrected to the voice coil 112 to move the voice coil 112 to the predicted position of X1 as determined by the transducer prediction model block 156. The transducer prediction model block 156 includes a transducer model block 160, a pressure model block 162, and a passive radiator model block 164). The transducer model block 160 executes equations, 2, 7, 8, 9, and 10. The pressure model block 162 generally executes equation 6 and the passive radiator model block 164 generally executes equation 3. Given Kms_TD (X1), BL(x) from their respective polynomials and the target current (I_target from the equalization block 152), the corrected current (e.g., I current) to compensate for the non-linearities in Kms_TD(x) and BL(x) can be calculated as follows:

$$I_{corrected} = I_{target} \cdot \frac{BL(0)}{BL} + \frac{x \cdot (Kms - Kms(0))}{BL} \quad \text{Eq. (11)}$$

Figure 7:
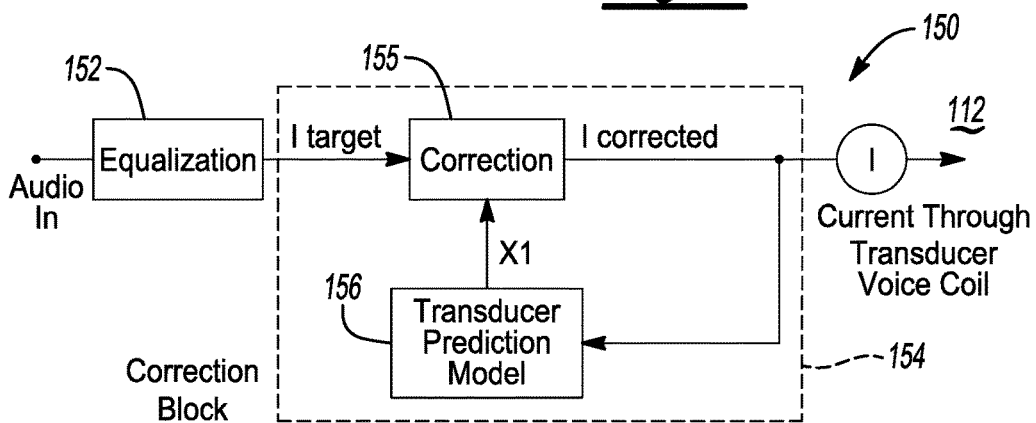
FIG. 7 represents the amplifier system of FIG. 6 and further includes a core correction block in accordance to one embodiment.

In general, the target current may be proportionately increased if BL(x) is less than BL(0) and has an amount added to offset the error in force due to the change in spring stiffness. In such a system, however a frequency response may be incorrect because the electrical damping provided by the resistance of the voice coil 112 may be negated by the amplifier 150 (or current source). The aspect may be compensated for by using a fixed equalization filter in the equalization block 152. FIG. 7 represents the amplifier 150 of FIG. 6 and further includes a core correction block 155 which can be improved on in later implementations.

Correction Via a Voltage Source

Figure 8:
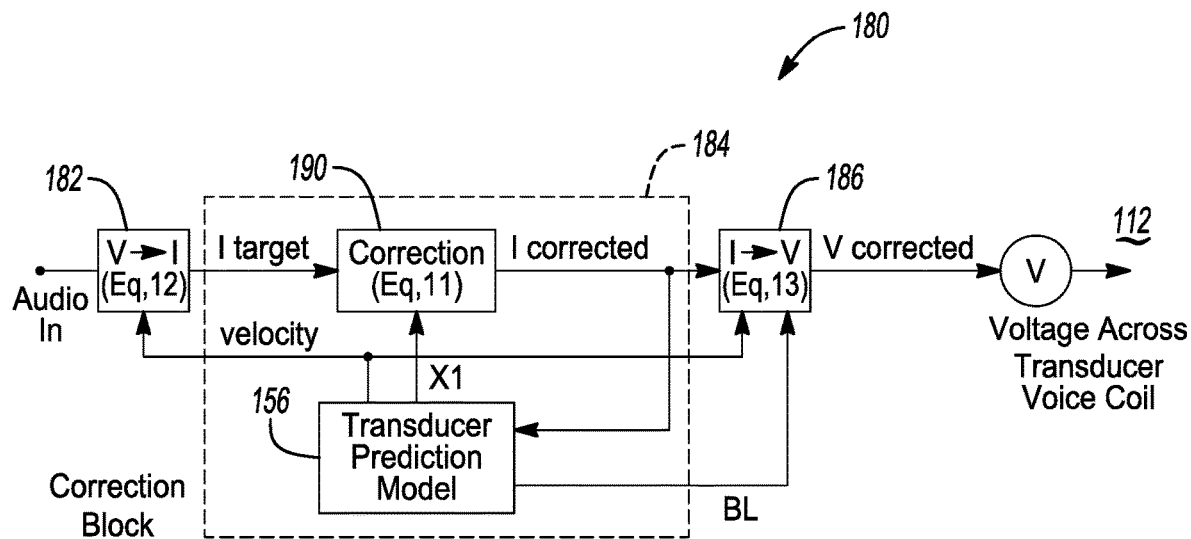
FIG. 8 depicts a correction system that serves as a voltage source to drive the voice coil in accordance to one embodiment.

FIG. 8 depicts an audio amplifier system 180 that serves as a voltage source to drive the voice coil 112. The system 180 includes a current transform block 182, an adaptation block 184, and a voltage transform block 186. The system 180 provides a corrected voltage to the voice coil 112 of the transducer in response to the audio input signal. The adaptation block 184 includes a core correction block 190 and the transducer prediction model block 156. In general, the system 180 converts a target voltage (from an equalization block that is not shown (the target voltage is generated based on the audio input signal)) into a target current (i.e., I_target)) via the current transform block 182. The core correction block 190 corrects the target current to generate a corrected current (i.e., I_corrected). The voltage transform block 186 converts I_corrected into a corrected voltage (i.e., V_corrected) which is used to drive the voice coil 112. A voltage source amplifier (not shown) applies V_corrected to the voice coil 112. The system 180 ignores the effects of the inductance of the voice coil 112, which generally works if the correction is for lower frequencies of the system 180. This may be valid because most of the movement and non-linearity occurs at a low frequency.

The system 180 also utilizes a predicted velocity of the diaphragm 110 in addition to the position of the diaphragm, X1 (see outputs from the transducer prediction model block 156). The current transform block 182 utilizes the velocity of the diaphragm 110 to convert the audio signal (which is proportional to a voltage) to the target current, I_target and transmits the same to the core correction block 190. The voltage transform block 186 also converts I_corrected to a signal that is proportional to the voltage that is to be applied to the voice coil 112. The transducer prediction model block 156 also provides the predicted BL (or predicted magnetic flux X and the length of the air gap 118). The voltage transform block 186 also requires the predicted BL to convert the I_corrected to the V_corrected as per equation 13 which is set forth below.

In general, it is necessary to convert the target voltage (i.e., the input into the current transform block 182) into I_target for use in the transducer prediction model 156. For example, movement of the voice coil 112 carries a current that produces a voltage proportional to the velocity times "B" times "L" which corresponds to a length of an air gap; this may be referred to as a back EMF of the voice coil 112.

This provides a voltage that is subtracted from the voltage (i.e., V_corrected) that is applied to the voice coil 112 leaving the balance across a resistance of the voice coil resistance (e.g., Rvc). The linear target current (i.e., I_corrected) that would match the voice coil current if BL(x) was linear can then be calculated by the following:

$$I_{target} = \frac{(V_{target} - \text{velocity} \cdot BL(0))}{Rvc_{nominal}} \quad \text{Eq. (12)}$$

Once the target current is corrected as similarly noted before, this needs to be converted back to a corrected voltage (i.e., Vcorrected). Based on the same relationship, this may be accomplished with the following equation:

$$V_{corrected} = I_{corrected} \cdot Rvc_{Avg} + BL \cdot \text{velocity} \quad \text{Eq. (13)}$$

Variation in the Voice Coil DC Resistance (Rvc)

In a simple approach, a resistance of the voice coil 112 may be assumed to be constant. Assuming that the resistance of the voice coil 112 is constant, $Rvc_{Avg}$ in Eq. (13) would be set to $Rvc_{nominal}$. In general, voice coils be formed of copper or aluminum. These materials may encounter a change of resistance as their corresponding temperature changes. Thus, to improve the voltage source implementation of the system 180, a thermal model may be used to estimate a temperature rise of the voice coil 112 and thereby calculate a temperature corrected resistance of the voice coil 112. The power in the voice coil 112 may be obtained because the current is predicted as I_corrected. There are several thermal models that may be used based on accuracy. The simplest may be an RC model where R represents the thermal resistance of the voice coil 112 to ambient and C represents the specific heat capacity of the voice coil 112. The RC model can also be solved iteratively using Euler's method.

One example of Euler's method to iteratively solve system equations is set forth direction below. By looping through code of an algorithm as shown below, over and over, the algorithm solves the various system of equations in small time steps such that equations may move over a small-time step to be considered and treated as linear. For example, a time step of 200 uS (for a sample rate of 5 kHz) may adequately model a typical loudspeaker. This model may require down-sampling or decimation at the input (e.g., audio input which may be, for example, 48 KHz) and Vcorrected and Icorrected output which may be 48 KHz) and up-sampling with an interpolation filter at the output (e.g., and Vcorrected and Icorrected output which may be 48 KHz). With this approach, a fixed-point full implementation may require about 5-6 MIPS per channel for a full passive radiator system and a minimum of 1-2 MIPS for a closed box system.
*/
//Solving for the transducer motion:
//dt is defined as a small-time step of the sampled system X1=X1+Velocity_TD*dt;

Force_damping_TD=-Velocity_TD*Rms(X1)_TD;

Force_spring_TD=-X1*Kms(X1)_TD

Force_pressure_TD=-k*pressure*Sd_TD;

Force_motor=BL(X1)*Ivc_corrected;

Force_net _TD=Force_damping_TD+
    Force_spring_TD+Force_pressure_TD+Force_motor;

Velocity_TD=Velocity_TD+Force_net_TD/M_TD*dt;

//Solving for a motion of the passive radiator 104:

Force_damping_PR=−Velocity_PR*Rms(X2,Velocity_PR)PR;

Force_spring_PR=−X2*Kms(X2)_PR;

Force_pressure PR=k*pressure*Sd_PR;

Force_net _PR=Force_damping_PR+
    Force_spring_PR+Force_pressure_PR;

Velocity_PR=Velocity_PR+Force_net_PR/M_PR*dt;

X2=X2+Velocity_PR*dt;

//Solving for a change in pressure of the enclosure 101:

pressure=p_0*(Sd_TD*X1−Sd_PR*X2)/(Vb+Sd*X1+Sd_PR*X2);

//Solving for a corrected current of the voice coil 112:

Ivc_corrected=Ivc_target*BL(0)/BL(X1)+(Kms(X1)−Kms(0)*X1/BL(X1);

//For the voltage source algorithm, the following C-code may be added:
//Solving for Ivc_target Ivc_target=(EQ_out−Velocity_TD*BL(X1))/Rvoice_coil;

//Solving for a corrected voltage of the voice coil 112:

V_voicecoil=Ivc_corrected*Rvoice_coil+BL(X1)*Velocity_TD.

Variation in Kms and Rms as a Result of Motional History

The model has also assumed that Kms and Rms, while in motion, is defined by one polynomial. In fact, these parameters may vary with a "history" of movement. For example, the suspension 114 of the diaphragm 110 may soften as the diaphragm 110 is moved with significant velocity and displacement. This may change both Rms and Kms.

As an improvement, the values of Kms and Rms may be scaled using an estimate of the changing value of Rms(0) and Kms(0) with time. Since the polynomials for Kms(x) and Rms(x) are normalized to the rest position, the time varying parameter can multiply directly the normalized position varying parameter to determine a more accurate Kms and Rms.

The softening and stiffening of the suspension 114 of the diaphragm 110 as a function of position can be predicted as an average over time which may be modeled as a sum of exponential decays, where the input to the averaging corresponds to a steady-state value of Kms and Rms that may result if the magnitude of the motion where applied indefinitely. This steady-state value of Kms may be represented as a polynomial Eq. (14)) of the envelope of the changing position.

$$Kms_{steadystate}=a_1 \cdot |x|+a_2 \qquad \text{Eq. (14)}$$

The exponential decay may take the form of the following equation.

$$\frac{1}{n} \cdot \left(e^{\frac{-t}{\tau_1}} + e^{\frac{-t}{\tau_2}} \ldots + e^{\frac{-t}{\tau_n}}\right) \qquad \text{Eq. (15)}$$

An average Kms (or $Kms_{Avg}$) may then be calculated by multiplying Eq. (15) with Eq(14). This average Kms would then replace the Kms(0) in Eq. (8) to provide:

$$Kms=(cK_4 \cdot x^4+cK_3 \cdot x^3+cK_2 \cdot x^2+cK_1 \cdot x+1) \cdot Kms_{Avg} \qquad \text{Eq. (16)}$$

The same form of equation may be used for Rms steady-state $$Rms_{steadystate}=b_T \cdot |x|+b_2 \qquad \text{Eq. (17)}$$

steady-state Rms

As with Kms, Eq. (15) and Eq. (17) can be used to relate the steady state Rms to the magnitude of motion. An average Rms may then be calculated by multiplying Eq. (15) with Eq(17). This average Rms would then be then replace Rms(0) in Eq. (9) to provide:

$$Rms=(cR_4 \cdot x^4+cR_3 \cdot x^3+cR_2 \cdot x^2+cR_1 \cdot x+1) \cdot Rms_{Avg} \qquad \text{Eq. (18)}$$

$Kms_{Avg}$ and $Rms_{Avg}$ as set forth in equations 15 and 16 takes the history of the predicted positions of the voice coil 112 by averaging X1 over its recent history.

Figure 9:
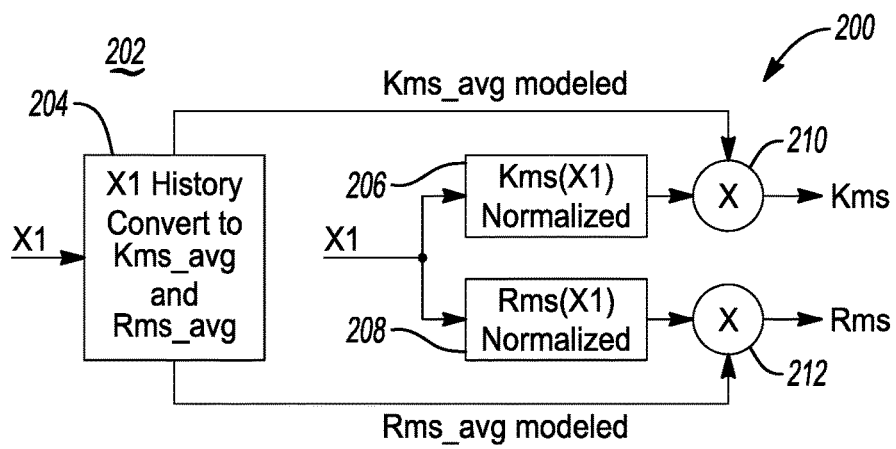
FIG. 9 illustrates a system that executes a model for providing Kms and Rms in accordance to one embodiment.

FIG. 9 illustrates a system 200 that executes a model for providing Kms and Rms.

The system 200 may be a part of the transducer prediction model block 156. The system 200 generally includes a controller 202 to execute the model for providing Kms and Rms. The system 200 also includes a conversion block 204, a Kms normalization block 206, and an RMS normalization block 208, a first multiplier circuit 210, and a second multiplier circuit 212. The conversion block 204 is generally configured to convert a history of X1 to an average value of Kms (or $KMS_{avg}$) (e.g., an average spring model signal). The conversion block 204 is generally configured to convert a history of X1 to an average value of Rms (or $Rms_{avg}$) (e.g., an average damping model signal). The system 200 provides Kms as represented by Eq. 16 above. The system 200 also provides Rms as represented by Eq.18 above. The Kms normalization block 206 (or spring normalization block) is programmed to normalize the spring stiffness of the loudspeaker 102 to a resting position that corresponds to the predicted position of the voice coil 112 being set to zero. The Rms normalization block (or damping normalization block) 208 is programmed to normalize the damping of the loudspeaker 102 to the resting position (e.g., the predicted position of the voice coil 112 is set to zero).

FIG. 10 generally illustrates a system 250 that also executes a model for providing Kms and Rms. The system 250 includes the conversion block 204, the Kms normalization block 206, the RMS normalization block 208, the first multiplier circuit 210, and the second multiplier circuit 212. The conversion block 204 generally includes an envelope block 252, an averaging block 254, a Kms steady state block 256, an Rms steady state block 258, a Kms exponential decay block 260, an Rms exponential decay block 262, a Kms select circuit 264, and a RMS select circuit 266. The system 250 provides, but not limited to, an improved approximation of Kms_avg and Rms_avg by using different time constants as set forth in Eq. (15). The improved Kms_avg and Rms_avg may be based on whether the suspension 114 of the diaphragm 110 is softening or stiffening. In other words, the system 250 takes into account when the amount of motion of the diaphragm 110 is increased or decreased compared to recent motion. This aspect may be performed with a selection operation that compares the Kms_avg or Rms_avg to a predicted steady-state Kms or Rms. If the average value is less than steady-state value, then the suspension 114 of the diaphragm 110 may be softening, and the softening time constants may be selected. Otherwise, if the average value is greater than a steady-state value, then the suspension 114 of the diaphragm 110 may be stiffening and the stiffening times constants are then selected. This will be described in more detail below. In general, the conversion block 204 is configured to generate and store any number of predicted positions of the voice coil 112 (e.g., X1) to provide a history of the generated predicted positions of the voice coil 112. For example, the conversion block 204 is configured to perform integration, peak detection, and/or averaging over a period time to determine the history of the generated predicted positions of the voice coil 112. The system 250 may be part of the transducer model block 160 as set forth in FIG. 6 which is part of the transducer prediction model 156. It is recognized that the system 150 includes memory (not shown) to store the history of the generated predicted positions of the voice coil 112.

At the input, the envelope block 252 receives the position signal (e.g., X1) and provides an envelope of the position signal. The averaging block 254 applies a peak hold to the envelope generated by the envelope block 252. The output of the averaging block 254 represents a short-term average level of motion and therefore the softening potential of the motion for the suspension 114. The Kms steady state block 256 provides a steady state Kms value (e.g., the predicted steady state) and the Rms steady state block 258 provides a steady state Rms value (e.g., the predicted steady state). Each of the Kms select circuit 264 and the Rms select circuit 266 includes a first or higher order polynomial to convert the average motion to a steady-state amount of suspension softening in response to the steady state Kms value and the steady state Rms values, respectively. The Kms exponential decay block 260 and the Rms exponential decay block 262 receive the steady state Kms value and the steady state Rms value, respectively, to model the time dependent aspect of the softening behavior of the suspension 114 of the diaphragm 110.

As a refinement, different exponential decay time constants may fit better than the actual behavior of the suspension 114. In particular, the suspension 114 of the diaphragm 110 may soften more quickly than the suspension 114 hardens (as the motion is reduced or stopped). To model this aspect, the Kms select circuit 264 compares the steady-state predicted softness (or the steady state Kms value) to the modeled average of Kms and if the steady state Kms value (or predicted softness) is softer than the current value predicted by the exponential decay (or the modeled average of Kms), then a softening τ is used in the exponential decay (or applied to the Kms exponential decay block 260). If on the other hand, the steady state Kms value (or predicted softness) is stiffer than the current value predicted by the exponential decay (or the modeled average of Kms), then a stiffening τ is used in the exponential decay (or applied to the Kms exponential decay block 26). Similar aspects are applied with respect to the steady state Rms value (or predicted softness), the modeled average of Kms, the comparison of the same to one another, and the utilization of the softening τ and a stiffening τ as applied to the Rms exponential decay block 262 by the Rms select circuit 266.

Providing an Adaptive Kms and Rms

In some cases, it is possible to measure the current of the voice coil 112 as used in connection with the system 180 (e.g., the system 180 that serves as a voltage source to drive the voice coil 112 set forth in connection with FIG. 8) in real time while playing music or other audio. Likewise, it is possible to measure the voltage of the voice coil 112 as used in connection with the system 150 (e.g., the system 150 that serves as a current source to drive the voice coil 112) in real time while playing music or other audio. If this is performed, there are other implementations to measure the value of Kms and Rms or the average of Kms and Rms over time. FIG. 11 depicts one example of such an implementation (or apparatus) 300 that measures the value of Kms and Rms in accordance to one embodiment. The apparatus 300 includes a first bandpass filter 302, a second bandpass filter 304, a first lowpass filter 306, a second bandpass filter 308, a divider circuit 310, a first polynomial block 312, and a second polynomial block 314. The first bandpass filter 302 may receive a signal corresponding to a measured voltage of the voice coil 112. The second bandpass filter 304 may receive a signal corresponding to a measured current across the voice coil 112. The first and the second bandpass filters 302 and 304 bandpass filter the voltage and the current at predetermined frequencies. The first low pass filter 306 and the second low pass filter 308 converts an instantaneous value of Vvc measured (e.g., measured voltage of the voice coil 112) and Ivc measured (e.g., measured current of the voice coil 112), respectively, and converts the same to a corresponding rms value for an average voltage of the voice coil 112 (e.g., Vvc_avg) and an average current of the voice coil 112 (e.g., Ivc_avg). The divider circuit 310 divides Vvc_avg over Ivc_avg to provide an impedance (e.g., Zavg).

Figure 12:
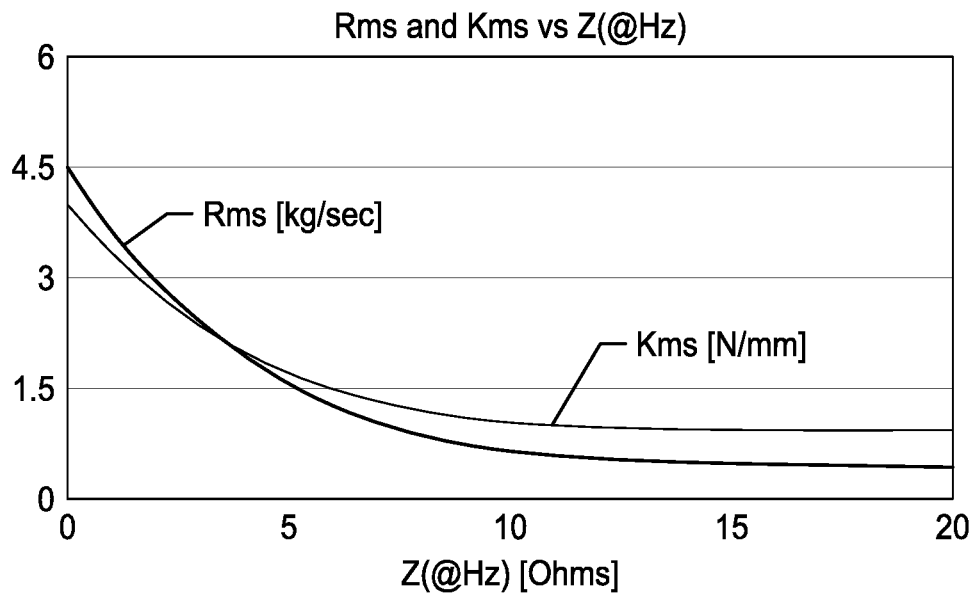
FIG. 12 depicts corresponding values of Rms and Kms as a function of impedance in accordance to one embodiment.

In one method, since the impedance presented by the voice coil 112 at any given frequency is the root mean square voltage at that frequency divided by the root mean square current at that frequency (by bandpass filtering the current and voltage at specific frequencies), and converting the filtered result to an rms value and dividing them can provide the average impedance presented by the voice coil 112 at the given frequency. In general, the first polynomial block 312 and the second polynomial block 314 are configured to fit curves of Kms(z) and Rms(z) as illustrated in FIG. 12. It is recognized that Kms and Rms are part of the transducer model block 160 as set forth in FIG. 6 by virtue of equations 2 and 3 which include KmsTD and RmsTD and then Kms_PR and Rms_PR. The transducer model block 160 provides X1 (e.g., the predicted position of the voice coil 112 and the correction block 154 generates I_corrected which corresponds to a current to be provided to the voice coil 112) such that the voice coil 112 moves to the predicted position within the loudspeaker 102.

FIG. 12 depicts corresponding values of Rms and Kms as a function of impedance in accordance to one embodiment. In general, many combinations of Rms and Kms may result in a same impedance at a specific frequency. With the loudspeaker 102, since the Rms and Kms for the loudspeaker 102 tend to vary in a predictable manner, there may be in many cases one or a unique set of Rms and Kms values for a specific frequency and a specific average impedance. This is generally illustrated in FIG. 12.

Therefore, if the impedance at the specific frequency is known, it is possible to predict the values of Kms and Rms. One manner to calculate Kms and Rms from the impedance at a specific frequency may involve using a polynomial to match the curve for each of Kms and Rms as shown in the FIG. 12.

In some cases, the suspension 114 of the diaphragm 110 may soften more quickly than can be detected using the measured impedance implementation (e.g., the system 300)

as noted in connection with FIG. 11. This may be case since the system 300 relies on obtaining the average, which takes time. If this is a problem, a hybrid approach can be used where the stiffening τ and the measured Kms and Rms are selected when the suspension 114 of the diaphragm 110 is stiffening, and the softening τ and the estimated stead-state Kms and Rms are selected when the suspension 114 of the diaphragm 110 is softening as noted above in connection with the system 250 of FIG. 10.

Figure 13:
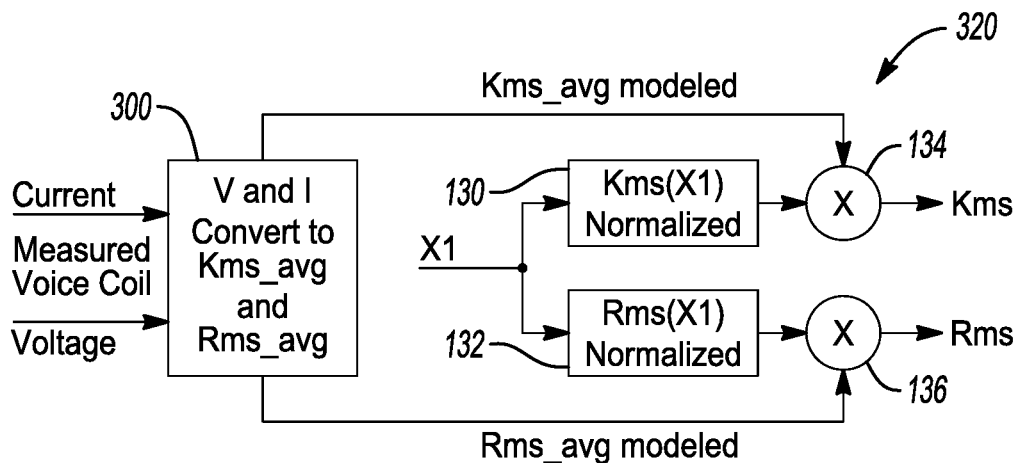
FIG. 13 generally illustrates a system for providing Kms and Rms in accordance to one embodiment.

FIG. 13 generally illustrates a system 320 for providing Kms and Rms in accordance to one embodiment. The system 320 includes the apparatus 300 in addition to the first normalization circuit 130, the second normalization circuit 132, the first multiplier circuit 134 and the second multiplier circuit 136 as set forth above in connection with FIG. 5. As discussed above, the apparatus 300 provides a measured average of Kms and a measured average of Rms. To model the non-linear Kms and Rms including the effects of position and motion history, the average rest value (e.g., measured average Kms and measured average Rms) can be multiplied via the first multiplier circuit 134 and the second multiplier circuit 136, respectively, with normalized polynomial models for Kms(x1) and Rms(x1) of the first normalization circuit 130 and the second normalization circuit 132 to provide Kms and Rms.

It is recognized that the systems 200, 250, 300, and 320 may be implemented within the transducer prediction model 156 as set forth in FIGS. 6, 7, and 8. For example, while the systems 200, 250, 300, and 320 of FIGS. 9, 10, 11, and 13 depict an input designated as X1, it is recognized that the systems 200, 250, 300, and 320 utilize X1 as feedback once generated by the transducer prediction model 156.

In some cases, it is possible that Rms and Kms may have similar behavior with both position and/or history. If this is the case, as a computational simplification, it possible to calculate only Kms, and provide the Rms with a scaler multiple of the value of Kms. In the same way, Kms and Rms of the passive radiator 104 may be appropriately scaled to the Kms and Rms of the transducer 102.

Providing an Adaptive Model for Rdc of the Voice Coil

In addition, by picking a frequency above a resonance of the loudspeaker 102 (i.e., where velocity and back EMF may be low) and below the frequency where an inductance of the voice coil 112 becomes significant and adds to the impedance, an approximately close value to the resistance of the voice coil 112 can measured by measuring the impedance at a mid-band frequency in a similar manner performed to determine Kms and Rms. The measured impedance may be close to the DC resistance of the voice coil 112. Since the DC resistance may be a function of temperature, the DC resistance may be used to determine the temperature of the voice coil 112 to determine if the voice coil 112 requires thermal protection, etc. Therefore, the measured DC resistance may also be used in place of the calculated voice coil resistance (e.g., Rvc_avg) in Eq. (13) based on a thermal model, to make the model further adaptive.

The Vented System Case

For various reasons, some loudspeakers are designed with a tuned port or vent instead of a passive radiator. This vent has an acoustic mass which, like the mass of the passive radiator 104, can resonate with the system to produce a low frequency output. The vent however may not have an equivalent to the stiffness Kms_PR of the suspension of the passive radiator 104. Thus, to solve for the motion of the acoustic mass in the vent, the value of Kms_PR may be set to zero. It is a characteristic of the motion of air in the vent that too may have frictional losses, especially at higher velocities. Therefore, it may be more accurate to include Rms vent where Rms vent is also a function of velocity as described for the Rms of the transducer 102.

The Closed Box Case

Some loudspeakers may be designed without a passive radiator or a tuned vent. Such loudspeakers are often referred to as closed box systems. In this case, it is possible to set the position of the passive radiator (x2) or vent equivalent to zero. For computational simplicity, there may not be a need to solve for the motion of diaphragm of the passive radiator since the passive radiator does not exist in the system.

Infinite Baffle Case

In systems where the transducer 102 is either mounted in a very large enclosure 101 (e.g., such as a back shelf in a vehicle which may include the entire trunk as the enclosure 101 or in a car door which is acoustically open to the outside), the system may be considered as an infinite baffle system. In this case, p(x1,x2) in Eq. (2) is set to zero and we can ignore Eq. (3).

Modeling the Passive Radiator

The same methods for predicting Kms and Rms of the transducer (i.e. Kms_TD, Rms_TD—see, Eq. (1)) may be applied to predict Kms and Rms of the passive radiator 104 as the suspension of the passive radiator 104 is similar in behavior to that of the transducer 102. However, as discussed above, it may be adequate to simply vary Kms and Rms of the passive radiator 104 in proportion to Kms_avg (measured or predicted). In general, it may be sufficient to model Kms_PR and Rms_PR as a fixed value to provide an improvement. This may apply to Kms_PR and Rms_PR from Eq. (2).

Adaptation to Non-Permanent Magnet-Based Moving Coil Transducers

In non-permanent magnet based moving coil transducers (or SAM drivers), the "B" (magnetic field) is continually changing as the magnetizing current (that is the current in the stationary coil) is continually being adjusted. The magnetic field effect may be corrected by utilizing a fixed equalization (e.g., similar to the equalization in the current source correction method described above) if a current source amplifier is used for the voice coil 112 or by a dynamic equalization whose frequency response is adjusted based on B as B changes over time if a voltage source amplifier is used. Then, further corrected by multiplying the equalized signal by B_nominal/B.

If the non-linear correction approach where to be adapted to the SAM driver, similar methods for determining a targeted (or magnetizing) current for the current of a stationary coil may be applied. However, the equalization functions for algorithms in SAM drivers may be replaced by those described herein. For example, a current source implementation (e.g., the system 150) as set forth in connection with FIG. 6 above may be used in connection with a current source implementation for the non-permanent magnet based moving coil transducer. If, however the voltage source implementation (e.g., the system 180) as set forth in connection with FIG. 8 may be used in connection with a voltage source implementation for the non-permanent magnet based moving coil transducer. This may suggest that the dynamic equalization function of the voltage source implementation for the SAM driver may be replaced by the conversion from voltage to a target current. Thus, the dynamic equalization may no longer be needed and may in fact be improved through aspects disclosed herein.

The function of multiplying the equalized signal by B_nominal/B may be replaced by substituting BL(0) with BL(I_stationary) in Eq. (7). This would replace Eq. (7) with the following:

$$BL = (cBL_4 \cdot x^4 + cBL_3 \cdot x^3 + cBL_2 \cdot x^2 + cBL_1 \cdot x + 1) \cdot BL(I_{stationary\_coil}) \quad \text{Eq. (19)}$$

With the SAM driver, a function that converts the magnetizing current to a flux density in the voice coil gap to "B" is provided. Simply multiplying this B by the fixed voice coil wire length, L provides BL(I_stationary) (i.e., the magnetic flux density and length of the fixed voice coil wire).

FIG. 14 depicts one implementation of an acoustic transducer arrangement (or audio amplifier system) 500 in accordance to one embodiment. The acoustic transducer arrangement 500 includes an input terminal, a control block (or controller) 503, and a transducer (or loudspeaker) 506. An input audio signal (e.g., Vi) 502 is provided to the input terminal of the control block 503. The control block 503 generates a moving coil control signal (e.g. $I_m$) and a stationary coil control signal (e.g., $I_S$). The transducer 506 includes magnetic material 512, a diaphragm 514, a former 516, a stationary coil 518, and a moving coil (or voice coil) 520. The moving coil 520 is attached to the former 516.

The magnetic material 512 is generally toroidal and has a toroidal cavity. The stationary coil 518 is positioned within the cavity. In various embodiments, the magnetic material 512 may be formed from one or more parts, which may allow the stationary coil 518 to be inserted or formed within the cavity more easily. The magnetic material 512 is magnetized in response to the stationary coil signal thereby producing a magnetic flux in the magnetic material 512. The magnetic material 512 includes a toroidal air gap 536 in a magnetic path 538 and magnetic flux flows through and near the air gap 536.

The magnetic material 512 may be formed of any material that is capable of becoming magnetized in the presence of a magnetic field. In various embodiments, the magnetic material 512 may be formed from two or more such materials. In some embodiments, the magnetic material 512 may be formed from laminations. In some embodiments, the laminations may be assembled radially and may be wedge shaped so that the composite magnetic material is formed with no gaps between laminations.

The moving coil 520 is mounted on the former 516 and receives the moving coil signal from the control block 503. The diaphragm 514 is mounted to the former 516 such that diaphragm 514 moves together with the former 516 and the moving coil 520. The former 516 and the moving coil 520 move within the air gap 536 in response to the moving coil signal and the flux in the air gap 536. In general, the various components of the acoustic transducer 506 that move with the former 516 may be referred to as moving components. Components that are stationary when the former 516 is in motion may be referred to as stationary components. Stationary components of the acoustic transducer 606 generally include the magnetic material 512 and the stationary coil 518.

In various embodiments, the acoustic transducer 506 may be adapted to vent air space between a dust cap 532 and the magnetic material 512. For example, an aperture may be formed in the magnetic material 512, or apertures may be formed in the former 516 to enable the air space to vent thereby reducing or preventing air pressure from affecting the movement of the diaphragm 514.

The control block 103 generally includes the core correction block 154, a filter 552 (e.g., $2^{nd}$ order filter), a conversion circuit 554, a correction block 556, a first current source 558, a second current source 560, a square root circuit 562, and a peak detector circuit 564. In general, the transducer arrangement 500 utilizes the first current source 558 and the second current source 560 to replace voltage sources which enable the transducer arrangement 500 suitable for automotive applications.

There is generally a need for a control method for providing currents to the stationary coil 518 and the moving coil 520 which incorporate benefits of both voltage and current sources and improves the transient response and provides improved latency, accuracy, as well as suitable protection and diagnostics. The control block 503 provides for a simplified frequency compensation by utilizing the first current source 558 for providing the moving coil signal (e.g., $I_m$) (or the voice coil signal). The first current source 558 eliminates the damping effect of a resistance of the moving coil 520 because the current (i.e., the moving coil signal) doesn't depend on an impedance of the moving coil 520. Therefore, the frequency response of the transducer 506 no longer depends on the moving coil signal (i.e., current) and is instead fixed. This aspect enables a single fixed non-time varying $2^{nd}$ order filter 552 to be used to compensate the frequency response.

The optimum efficiency for the transducer 506, including both the power for the stationary coil 518 and the moving coil 520 is achieved when the powers for the stationary coil 518 and the moving coil 520 are balanced (i.e., up to the point that a motor assembly steel for the transducer 506 begins to saturate, at which point a further increase of the current of the stationary coil 506 has no benefit). With the transducer arrangement 500, this is approximated via the square root circuit 562 of the audio signal level peak that is detected by peak detector circuit 564 to set the current for the stationary coil 518 since the power in resistance is proportional to the current squared. To use an output 504 from the square root circuit 562 directly, a proportional current source (i.e., the second current source 560) is used to drive the stationary coil 518.

To compensate for the changing sensitivity of the output 504 which is directly proportional to the stationary coil signal (or current for the stationary coil 518), the conversion circuit 554 can be used to calculate the magnetic flux in the air gap 536 of the moving coil 520 with a function B(i). The conversion circuit 554 provides the flux density (B(i)) to the core correction block 154. The flux density generally corresponds to the flux density in the air gap 536 of the moving coil 520 (or voice coil) as a function of the magnetizing or stationary coil current.

The transducer prediction model block 156 substitutes BL(0) with the BL (I_stationary) as set forth in Eq. (7) as set forth above to calculate BL. FIG. 15 generally illustrates one implementation (or circuit) 580 for calculating a product of the magnetic flux density B and the length of the voice coil wire (or moving coil wire) (L) in accordance to one embodiment. The circuit 580 generally includes a multiplier 582 and a normalize circuit 584. As shown, BL(0) (i.e., the product of the magnetic flux density B and the length of the moving coil wire (while the moving coil 520 is at rest)) is provided to the multiplier 582 and a position of the moving coil 520 (X1) is provided to the normalize circuit 584. The multiplier 582 takes the product of BL(0) and the output from the normalize circuit 584 to provide the product of the magnetic flux density B and the length of the moving coil wire (or, BL(x1)). As noted above, BL can be obtained via equation 7.

FIG. 16 generally illustrates circuit 580 for calculating a product of the magnetic flux density B and the length of the voice coil wire (or moving coil wire) (L) in accordance to one embodiment. In this case, BL(0) can be substituted with $BL(I_{stationary\_coil})$ (or BL(Is)) to provide BL(X1) or BL which is a function of the current in the stationary coil 518 and the position of the voice coil (or moving coil) 512. For example, it is possible to substitute the "B" from the core correction block 154 multiplied by "L" the length of the voice coil (which is a constant) to provide a new scalar portion at x=0 which is a function of the current in the stationary coil 518 and the position of the voice coil 520. This can be described in the following equation.

$$BL = (cBL_4 \cdot x^4 + cBL_3 \cdot x^3 + cBL_2 \cdot x^2 + cBL_1 \cdot x + 1) \cdot BL(I_{stationary\_coil})$$ Eq. (19)

Figure 17:
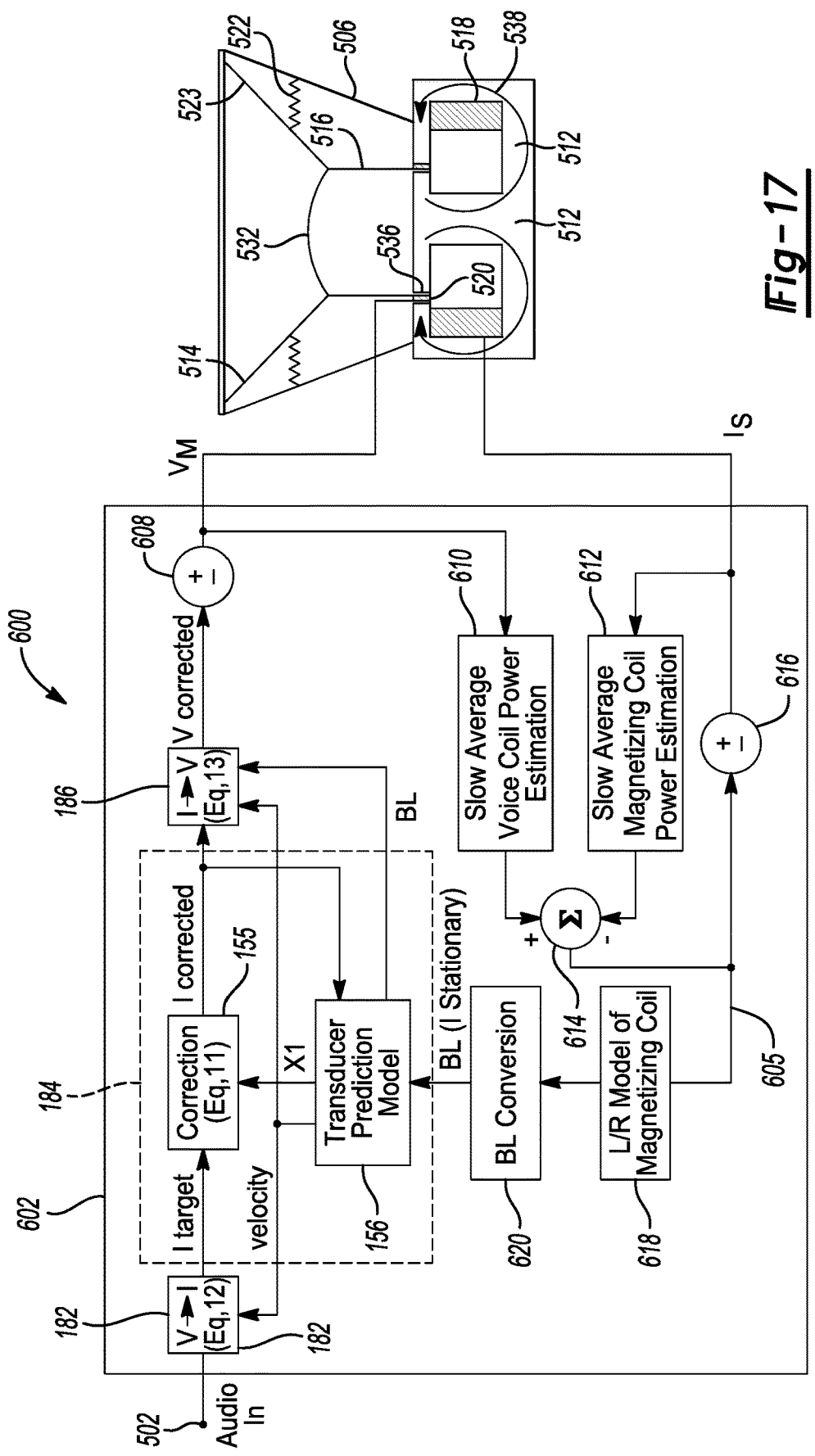
FIG. 17 generally illustrates another implementation of an acoustic transducer arrangement in accordance to one embodiment.

FIG. 17 generally illustrates another implementation of an acoustic transducer arrangement (or audio amplifier system) 600 in accordance to one embodiment. The transducer arrangement 600 generally includes the transducer 506 and a control block 602. The control block 602 generally includes the current transform block 182 (from FIG. 8), the adaptation block 184 (from FIG. 8), the voltage transform block 186 (also from FIG. 8), a first voltage source 607, a moving coil power estimation block 610, a stationary coil power estimation block 612, a subtractor circuit 614, a second voltage source 616, a stationary coil modeling block 618, and a conversion circuit 620. In general, the first voltage source 608 and the second voltage source 616 replace the first current source 558 and the second current source 560, respectively, as generally shown in connection with FIG. 14. In this case, the filter 552 of the control block 503 in FIG. 14 can no longer be fixed as the impedance of the moving coil 520 may no longer be negated by the first current source 558. With the arrangement 600, the conversion circuit 620 provides an output that is representative of the magnetic flux in the air gap 536 of the moving coil 520 with a function B(i). Similar to FIG. 8, the adaptation block 184 utilizes the output of the conversion circuit 620 to determine the correct BL for the model based on the varying "B" (or magnetic flux density)*the length of the voice coil 520 "L" via equation 19. The output of the conversion circuit 620 represents BL which is BL(I_stationary) and this represents BL (Is) (or BL(I_stationary)) of Eq. 19. In general, the output of conversion circuit 220 is scaled by the length of the winding (or wire) of the voice coil (or moving coil 520) which is the L in the output variable, BL. The voltage transform block 186 generates V_corrected which is provided as an input to the moving coil 520 based on BL.

However, now that the second voltage source 616 replaces the second current source 560, a target output current 605 is no longer directly proportional to the actual current of the stationary coil 518 due to the impedance of the stationary coil 518. To compensate for this aspect, the stationary coil modeling block 618 (e.g., inductance model) assumes that the resistance of the stationary coil 518 is known. In practice, it is not because of temperature effects which can change the resistance by 50% or more. These errors lead to errors in both frequency compensation and sensitivity compensation both in the steady state and in transient conditions when the current for the stationary coil 518 is changing.

It is recognized that the optimum efficiency for the transducer 506 may be achieved when the powers for the stationary coil 518 and the moving coil 520 are balanced. Thus, the arrangement 600 utilizes a square root approximation method. For example, the moving coil power estimation block 610 determines the average power for the moving coil 520 and the stationary coil power estimation block 612 determines the average power for the stationary coil 518. The subtractor circuit 614 compares the power for the moving coil 520 and the power for the stationary coil 518. If the average power for the moving coil 520 is greater than the average power for the stationary coil 518, then the subtractor circuit (or difference block) 614 increases the output 605 which is used as a target current (or the stationary coil signal) for the stationary coil 518 (or increases the current for the stationary coil 518 to avoid unnecessary audible sounds. This condition causes a decrease in power to the moving coil 520 and balances the powers between the stationary coil 518 and the moving coil 520. When this condition occurs, this essentially necessitates that the efficiency is slightly decreased however this condition may not be avoided because it is generally necessary to force the current to decrease quickly in the stationary coil 518. This aspect may generate audible sounds therefore as a trade off it is more advantageous to continue with a slight reduction in efficiency. The stationary coil modeling block 618 is generally configured to model stationary coil inductance behavior. For example, with the implementation of FIG. 17, a measurement of current is not performed. Rather, the stationary coil modeling block 618 is configured to predict the inductance behavior of the stationary coil 518 with a model (e.g., which is the L/R inductance/resistance model). In addition, the stationary coil modeling block 618 is further configured to determine the current in the inductor of the stationary coil 518 when voltage is applied to the stationary coil modeling block 618.

However, the average power should be estimated over a significantly longer period to avoid distortion and may be between 0.1 sec and 1 sec. This entails that in transient conditions, when the audio signal rapidly increases in level, the stationary coil signal (or current for the stationary coil 518) does not track quickly. The result is that the sensitivity of the transducer 506 remains low for a long period of time during a transient and therefore needs a significantly higher transient moving coil 520 amplifier peak power or the output SPL of the transducer 506 may be limited during transients. Additionally, the slow tracking of the stationary coil signal relative to a level of the input audio signal 502 can compromise efficiency because the balance of powers may not be maintained when the level of the input audio signal 502 has a high dynamic content.

Figure 18:
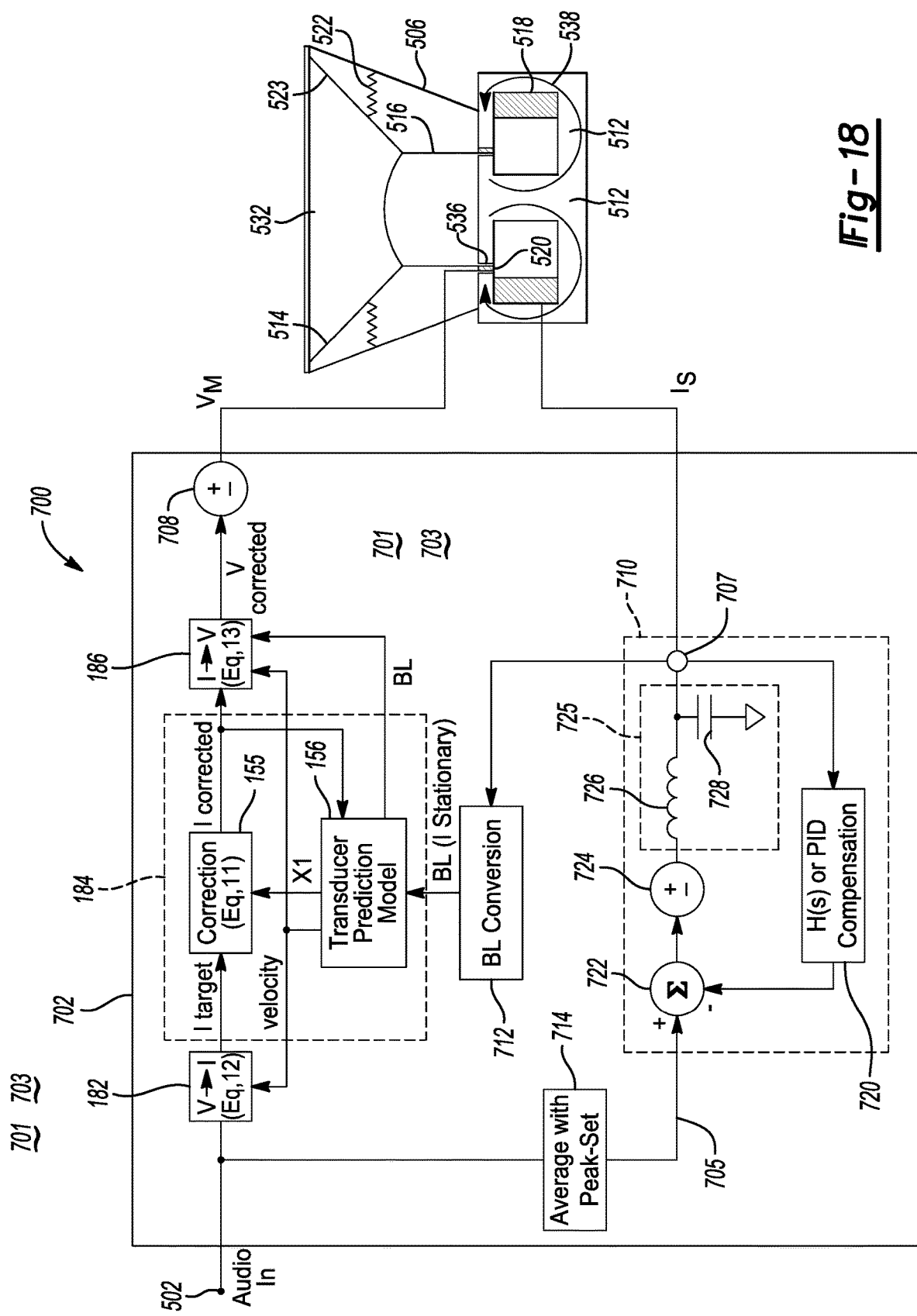
FIG. 18 generally illustrates another implementation of an acoustic transducer arrangement in accordance to one embodiment.

FIG. 18 generally illustrates another implementation of an acoustic transducer arrangement (or audio amplifier system) 700 in accordance to one embodiment. The acoustic transducer arrangement 700 includes the transducer 506 and an acoustic transducer controller (or controller) 702. The acoustic transducer controller 702 generally includes at least one digital processor 701 and memory 703. The digital processor 701 generally executes functions performed by the controller 702. The controller 702 generates and transmits the moving coil signal and the stationary coil signal to the moving coil 520 and the stationary coil 518, respectively in response to the receiving the input audio signal 502.

The arrangement 700 is generally configured to balance the powers between the stationary coil 518 and the moving coil 520 while achieving a fast transient response, improve the accuracy of frequency and sensitivity compensation in the presence of the changing current (i.e., the changing stationary coil signal) for the stationary coil 518, and improve the efficiency of the transducer 506, without relying on current sources to generate the stationary coil signal and the moving coil signal without introducing distortion. Moreover, as will be described in more detail, the arrangement 700 is generally configured to provide protection and diagnostics for electronics used in connection with the stationary coil 518.

The controller 702 includes the current transform block 182, the adaptation block 184, the voltage transform block 186, a voltage source 708, a complex source block 710, a conversion circuit 712, and a peak-set block 714. The complex source block 710 is provided to replace the second current source 560 as noted in connection with FIG. 14 and to replace the second voltage source 616 as noted in connection with FIG. 17. In general, the complex source block 710 is configured to control or tailor its impedance to generate the stationary coil signal for transmission to the stationary coil 518.

The average with peak-set block 714 takes peak values of the input audio signal 502 and uses a low pass filter to remove the ripple associated with a simple peak detector (similar to the peak detector circuit 564 of FIG. 14). During a transient, the slow changing low pass filter is forced to respond immediately to the transient by setting the value of the low pass filter directly to an instantaneous maximum absolute value of the input audio signal. In this way, a clean envelope of the input audio signal, with minimal ripple, of the input audio signal 502 can be generated that can respond to transient increases in the level of the audio signal and is provided as a reference signal 705 to the complex source block 710.

With this arrangement 700, the level of the input audio signal 502 can be used without the square root circuit 562 (or square root function) (of FIG. 14) because the output voltage of the source for the stationary coil 518 is a known voltage where the power is proportional to voltage squared. This means that the power in the moving coil 520 is proportional to the power in the stationary coil 518 since the stationary coil signal (or current provided to the stationary coil 518) is proportional to the input audio signal 502 via the reference signal 505 and power in the moving coil 520 is proportional to the current of the stationary coil 518 squared. This approach may not be as accurate as the power balance performed by the moving coil power estimation block 610 and the stationary coil power estimation block 612 because the noted approach ignores the effect of the frequency dependent impedance of the moving coil 520. However, for a musical and noise signal, an average scaling value can be chosen to approximate well enough the effect of the impedance of the moving coil 520 with music and noise.

The complex source block 710 measures the current provided to the stationary coil 518 (or the stationary coil signal) with a current measurement circuit 707. The current measurement circuit 707 may be a resistor, a current transformer, hall effect sensor, etc. The measured current (i.e., the measure stationary coil signal) is provided as a feedback to the compensation block 720 to provide an error signal to an adder circuit 722. The adder circuit 722 compares the reference signal 705 to the error signal (or subtracts the error signal from the reference signal 705) and adjusts a voltage source 724. It is recognized that the voltage source 724 may be implemented as pulse width modulated ("PWM") (or other modulation scheme) buck (or other topology) regulator along with a filter 725. The filter 725 generally includes an inductor 726 and a capacitor 728 to filter the voltage output from the voltage source 724. The compensation block 720 and the filter 725 generally have output an impedance such that the complex source block 710 looks like a current source, a voltage source, or a desired case of a mixed frequency dependent source. In particular, it may be desirable for the complex source block 710 to behave as a current source at low frequencies and as a voltage source at frequencies above a mechanical resonance of the transducer 106 (e.g., 50-100 Hz for a 6-inch mid-bass driver). This aspect may improve distortion in a pass band of the transducer 506 while providing accurate control over the average current of the stationary coil (or average of the stationary coil signal) and transient levels.

To achieve the behavior of an impedance with the complex source block 710, the compensation block 720 may be implemented as, for example, a Proportional-Integral-Derivative (PID) controller. For example, the compensation block 720 may include a proportional path with a gain "Kp" in the current feedback path where the current of the stationary coil signal is measured by the current measurement circuit 707. The integral and derivative terms (i.e., Ki and Kd) may be, for example, zero. Using the proportional current feedback K (i.e., Ki and Kd=0) is sufficient for the filter 725. The integral term, Ki and the derivative term, Kd are stable because the $2^{nd}$ order system created by the inductor 726 and the capacitor 728 is reduced to a first order system by virtue of current measurement with current measurement circuit 707 and a proportional current feedback, Kp. By using the proportional current feedback Kp in the feedback path, this condition creates an effective current source.

In this arrangement, the inductance of the inductor 726 is effectively eliminated (in a stability sense) by the current source created by using current feedback. By selecting the proper gain, Kp, in the feedback path for the compensation block 720, the frequency at which the natural impedance of the capacitor 728 has an effect on the output impedance can be tailored. The higher the gain for Kp, the higher the frequency will be. At high frequencies, the impedance provided by the complex source block 710 is dominated by the impedance of the capacitor 728 and thus looks like a voltage source. For this to be true, the size of the capacitance of the capacitor 728 should be sufficient such that, at the desired frequency above the resonance of the transducer 506, the impedance of the capacitor 528 is similar to or smaller than an impedance of the transducer 506. At low frequencies, where the impedance of the capacitor 728 is high, the output current will be dominated by the effective current source created by using current feedback. Thus, the control block 702 may provide the characteristic impedance of a current source at low frequencies and the characteristic impedance of a voltage source at high frequencies. Where the higher frequency is generally 3 to 5 times the mechanical resonance of the transducer 506 and the low frequency is generally any frequency that is below the high frequency. Finally, it is recognized that this same effect may be achieved by other control approaches such as, for example, utilizing voltage sensing and adding an integral term Ki as well as proportional term Kp and possibly a derivative term Kd for stability. The foregoing may be represented in the s-domain or z-domain.

In addition, in a system where more than one stationary coil 518 is to be fed current, it is possible to connect loads of the stationary coils 518 in parallel with one another and to use one control loop and a voltage source. However, to make the arrangement failsafe at an input between the controller 702 and the stationary coil 518, the measured current at the current measurement circuit 707 in the feedback path mentioned above may be the higher of the multiple currents of the stationary coils 518 at any instant in time. In this way, the current of the stationary coil 518 is regulated to load of the stationary coil 518 that provides the highest current.

In general, the level of current of the stationary coil 518 to optimize efficiency of the arrangement 700 is generally determined by the peak-set block 714. The peak-set block 714 receives the input audio signal 502. This arrangement assists in avoiding large variations in desired current of the stationary coil 518 near a resonance of the transducer 506. At a near resonance, less power is needed to produce the same acoustic output level. For this reason, the arrangements 500 and 600 may generally result in the current of the stationary coil 518 being reduced at a resonance to balance the power. However, as the current of the stationary coil 518 is reduced, the damping is reduced requiring even less power for the moving coil 520 which leads to a further reduction in the current of the stationary coil 518. This result can lead to an error near resonance in both the sensitivity and frequency response because the transducer 506 may be almost entirely damped by its mechanical losses. Thus, by providing the input audio signal 502 to the peak-set block 714, this condition bypasses the error noted above. While this may entail that the power balance between the stationary coil 518 and the moving coil 520 may not be maintained near resonance, this aspect may not matter because the power levels of the stationary coil 518 and the moving coil 520 are low near resonance.

The conversion circuit 712 may receive the measured current of the stationary coil 518 (i.e., the stationary coil signal) to determine the flux density in the air gap 536. The determined flux density in the air gap 536 is used to determine the changing acoustic frequency response and acoustic sensitivity of the transducer 506 as a function of the current of the stationary coil 518. If the measured current of the stationary coil 518 is used determine the magnetic flux in the air gap 536, then the adaptation block 184 may correct the sensitivity of the stationary coil 518. However, distortion may occur at some frequencies and levels if the measured current of the moving coil 520 is used to directly to determine the magnetic flux in the air gap 536 and hence sensitivity and frequency response.

In general, the stationary coil 518 replaces conventional magnets that are generally used to generate magnetic flux in the air gap 536 to enable the transducer 506 to output audio. However, the stationary coil 518 utilizes a high amount of current when the transducer 506 is to output high peaks of audio (i.e., drum roll, etc.). Thus, the controller 702 adjusts the current on Is based on the envelope of the input audio signal 502. The controller 702 lowers the current on Is when it is not necessary to output a high level of audio and increases the current on Is when it is necessary to output a high level of audio (i.e., provide dynamic adjustment of current).

The complex source 710 provides the output current Is to the conversion circuit 712 which provides a value corresponding to the magnetic flux in the air gap 536 of the moving coil 520 with a function B(i). The adaptation block 184 utilizes the output of the conversion circuit 712 to determine the correct BL for the model based on the varying "B" (or magnetic flux) via equation 19. The voltage transform block 186 generates V_corrected which is provided as an input to the moving coil 520 via the voltage source 708. The adaptation block 184 uses the flux value to provide the same frequency response for the input audio signal. The complex source 710 has an impedance characteristic of a voltage source or a current source. The complex source 710 forces the current of Is to climb quickly and quietly when the audio input signal has a large level.

The stationary coil 518 and the moving coil 520 are transformer coupled via the magnetic material 512. Consequently, a current in the moving coil 520 will produce a transformer coupled or reflected current in the stationary coil 518. At frequencies and signal levels where the reflected current of the moving coil 520 is large compared to the average of the current of the stationary coil 518, this distortion will be more prevalent or significant. When the stationary coil current is measured with a current measurement circuit 707, the measurement may include a current that is reflected from the current of the moving coil 520. However, the controller 702 may use the measured current to determine an acoustic sensitivity of the transducer 506. When the current phase relationship of the moving coil 520 is correct, the reflected current of the moving coil 520 to the stationary coil 518 may subtract from the average current of the stationary coil 518 thereby causing the conversion circuit 712 to calculate a lower flux density in the gap 536 and consequently lower sensitivity. This aspect may reflect more current in the stationary coil 518 which will subtract further from the average current in the stationary coil 518 causing the conversion circuit 712 to calculate a yet lower flux density in the gap 536 and ultimately increase the current of the moving coil 520. Thus, a positive feedback is established which causes the aforementioned distortion.

In the opposite phase, the current of the moving coil 520 can add to the average of the current of the stationary coil 518 causing the conversion circuit 712 to calculate a higher flux density in the gap 536. This provides the same positive feedback which then results in distortion. The result is that at some frequencies, the resulting output signal is asymmetrically distorted with large even order distortion components. In one aspect, it may be advantageous to separate the effect of the current of the moving coil 520 reflected to the stationary coil 518 that is used to determine the sensitivity compensation and also the frequency compensation.

Figure 19:
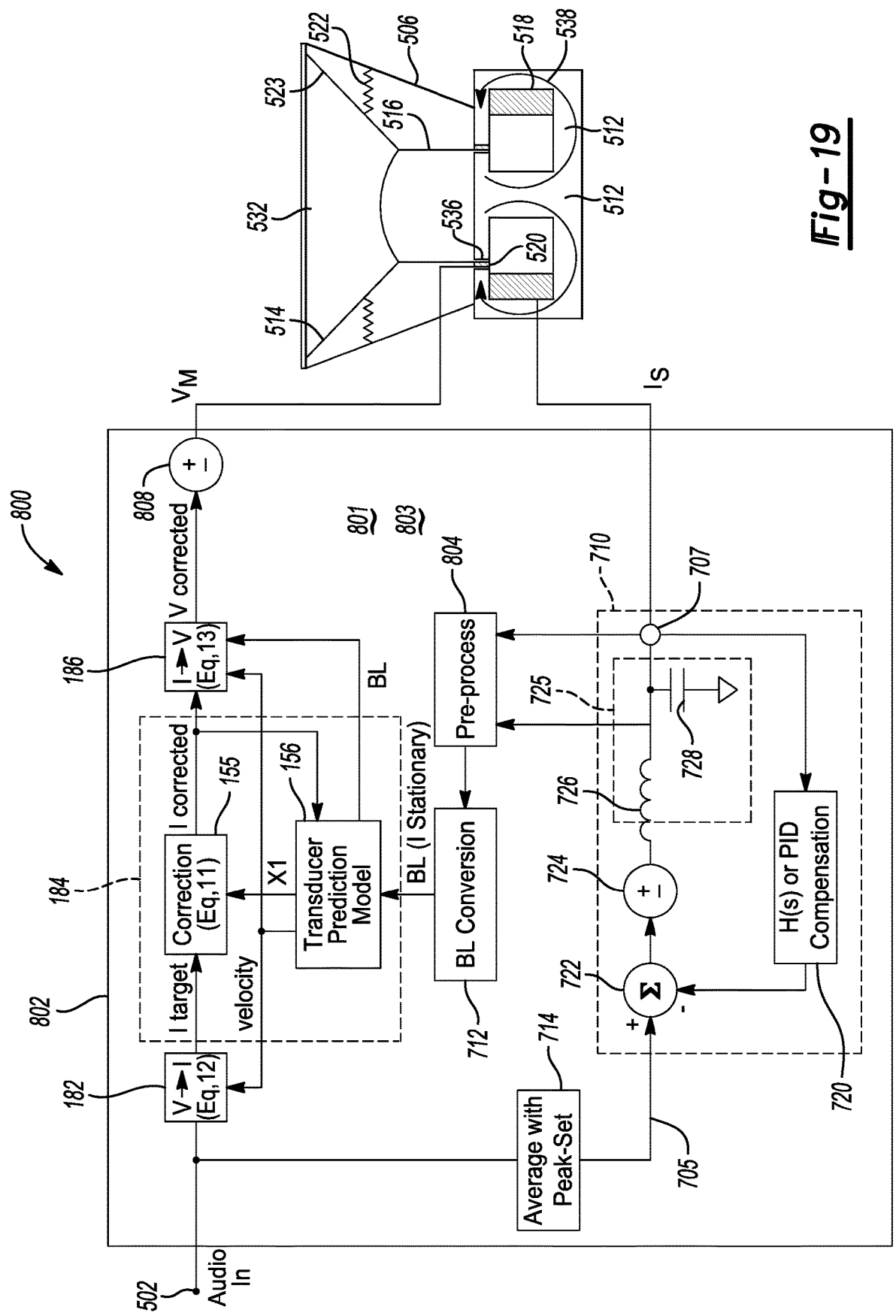
FIG. 19 generally illustrates another implementation of an acoustic transducer arrangement in accordance to one embodiment.

FIG. 19 generally depicts another implementation of the acoustic transducer arrangement (or audio amplifier system) 800 in accordance to another embodiment. The acoustic transducer arrangement 800 includes the transducer 506 and an acoustic transducer controller (or controller) 802. The acoustic transducer controller 802 generally includes at least one digital processor 801 and memory 803. The digital processor 801 generally executes functions performed by the controller 802. The acoustic transducer controller 802 generates and transmits the moving coil signal (Im) and the stationary coil signal (Is) to the moving coil 520 and the stationary coil 518, respectively, in response to receiving the input audio signal 502.

The controller 802 includes the current transform block 182, the adaptation block 184, the voltage transform block 186, a voltage source 808, the complex source block 710, the conversion circuit 712, and the peak-set block 714. and a pre-processing block 804. With the arrangement 800, the measured current of the stationary coil 518 is not directly used to determine the magnetic flux of the air gap 536 of the moving coil 520. Rather, the pre-processing block 804 pre-processes the measured current of the stationary coil 518. For example, the pre-processing block 804 takes the long-term average voltage amplitude of the stationary coil 518 which is measured at current measurement circuit 707 to determine the average resistance of the stationary coil 518. The average resistance of the stationary coil 518 is used in an L/R model of the stationary coil 518 to predict an effective average current of the stationary coil 518 which then will be absent the reflected current from the moving coil 520. The L/R model is similar to that of the stationary coil modeling block 618 (see FIG. 17) but where the resistance R of the stationary coil 518 has been measured and thereby included more accurately. In this case, a resistance and an internal temperature of the moving coil 520 may be known on an accurate basis which assists in predicting the effective average current of the stationary coil 518. It is recognized that the resistance of the moving coil 520 may be difficult to calculate when the current of the stationary coil 518 is low, and the inductance is generally an ideal approximation of an actual inductance of the stationary coil 518 which may include all of the non-ideal aspects of an inductor such as magnetic remanence, saturation, and other effects in the steel.

The pre-processing block 804 is configured to take a fast average with a peak-set function of the measured current. The pre-processing block 804 first takes a peak detected value of the measured current of the stationary coil 518 and then utilizes a low pass filter therein to average the peak detected values. The filtering removes most of the reflected current from the moving coil 520 from the measured current of the stationary coil 518. To respond to transient, fast climbing currents of the stationary coil 518, a value of the pass filter may be forced to the peak value during a fast climbing stationary current. This may be optimal to eliminate the distortion issue noted above except with pure sine waves with frequencies below the cutoff frequency of the low pass filter where the filter is no longer able to estimate the average stationary current.

Similar to FIG. 18 above, the control block 710 provides the output current Is to the conversion circuit 712 which provides a value corresponding to the magnetic flux in the air gap 536 of the moving coil 520 with a function B(i). The adaptation block 184 utilizes the output of the conversion circuit 712 to determine the correct BL for the model based on the varying "B" (or magnetic flux) via equation 19. The voltage transform block 186 generates V_corrected which is provided as an input to the moving coil 520 via the voltage source 808.

Figure 20:
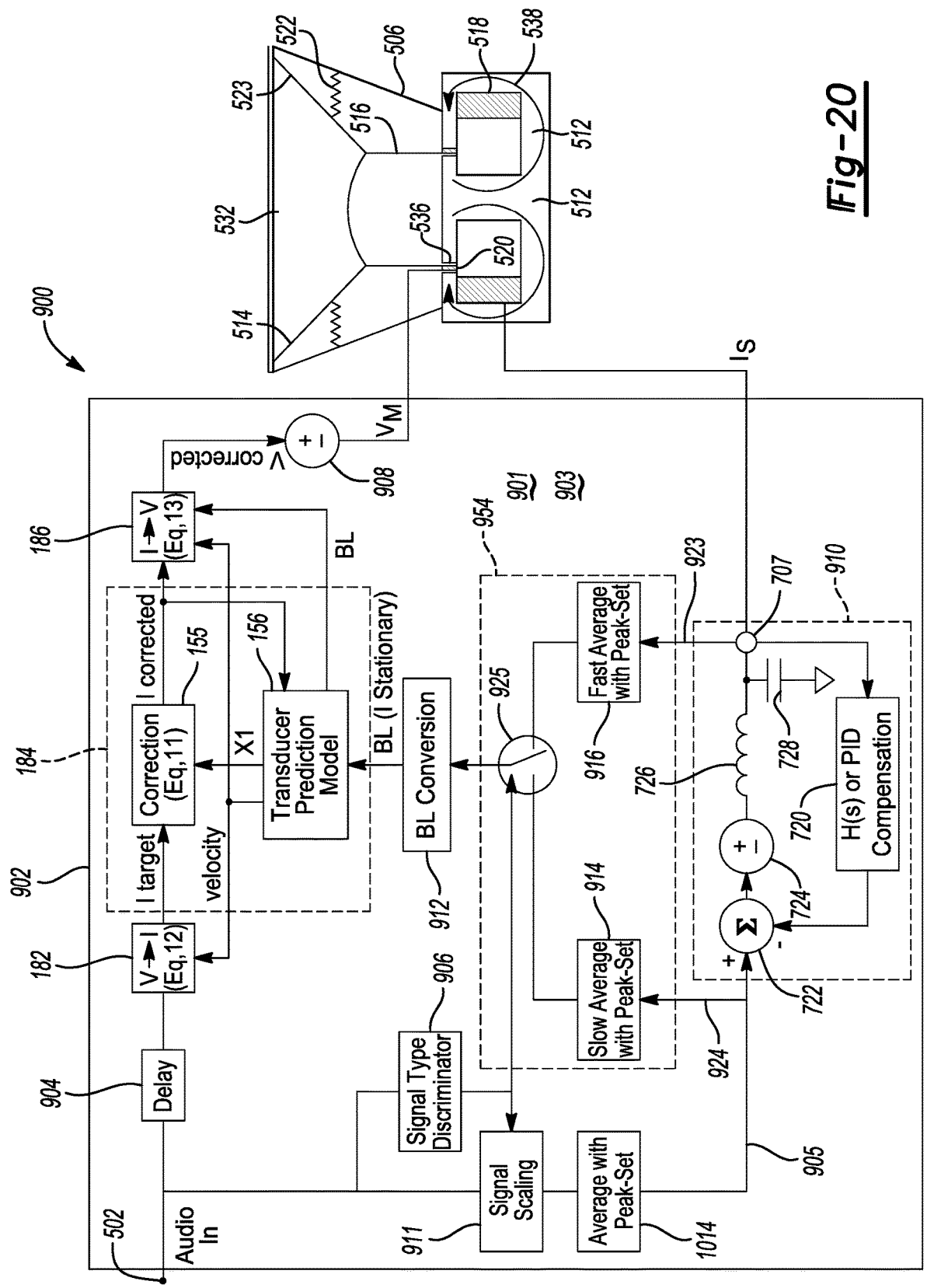
FIG. 20 generally depicts another implementation of the acoustic transducer arrangement in accordance to one embodiment.

FIG. 20 generally depicts an acoustic transducer arrangement (or audio amplifier system) 900 in accordance to another embodiment. The acoustic transducer arrangement 900 includes the transducer 506 and an acoustic transducer controller (or controller) 902. The acoustic transducer controller 902 generally includes at least one digital processor 901 and memory 903. The digital processor 901 generally executes functions performed by the controller 902. The controller 902 generates and transmits the moving coil signal (e.g., Im) and the stationary coil signal (e.g., Is) to the moving coil 520 and the stationary coil 518, respectively, in response to receiving the input audio signal 502.

The controller 902 includes the current transform block 182, the adaptation block 184, the voltage transform block 186, a voltage source 908, a complex source block 910, a conversion circuit 912, a peak-set block 1014, a pre-processing block 954, a delay block 904, a signal type discriminator block 906, and a signal scaling block 911. A feedback path 923 and a feedforward path 924 are shown as providing inputs to the pre-processing block 954. For example, the pre-processing block 954 includes a peak-set block (or slow average with peak-set block) 914, a switch 925, and a fast average peak-set block 916. The signal type discriminator block 906 is provided to select the switch 925 such that the feedback path 923 or the feedforward path 924 is selected to provide an input to the conversion circuit 912 coming from either the peak-set block 914 or the fast average peak-set block 916.

The signal type discriminator block 906 determines when the input audio signal 502 is below the cutoff frequency (or predetermined frequency) of the low pass filter of the pre-processing block 954 or is primarily a sine-wave in nature (e.g., a single tone or test signal with a single frequency). If this condition is true (i.e., the input audio signal 502 is a sine-wave), then peak-set block 914 can be used in feedforward path 924 with the switch 925 as the input to the conversion circuit 912. As noted above, the peak-set block 914 provides the target current of the stationary coil 518. This mode eliminates the effect of the reflected current of the moving coil 520 by eliminating the feedback path 923 as the feedback path is not is use. In addition, the peak-set block 914 includes a fast peak-set function in the same way that the fast average peak-set block 916 has, to allow fast transients to set the output of block 514 to eliminate the delay associated with the averaging filter.

In the event the signal type discriminator block 906 determines that the input audio signal 502 is above the cutoff frequency of the low pass filter of the pre-processing block 954 (or that the input audio signal 502 is not a primarily a sine-wave in nature), then the fast average peak set block 916 can be used in feedback path 923 with the switch 925 providing an output from the fast average with peak set block 916 to the conversion circuit 912. The fast average with peak-set block 916 functions similarly to the average with peak set block 714. However, the cutoff frequency of the averaging low pass filter of the fast average peak-set block 916 is comparable to the resonance of the transducer 506. This duplicates the operation of pre-processing block 954 with input audio signals. The fast average peak-set block 916 provides an envelope of the current through the stationary coil 518 when the envelope corresponds to rapid changes in the measured current. The complex source block 910 is configured to provide the current of the stationary coil 518 to the fast average peak-set block 916.

The signal scaling block 911 scales the level of the target current of the stationary coil 518 based on the nature of the input audio signal 502 as detected by the signal type discriminator block 906. In this way, an optimum current of the stationary coil 518 is provided to balance the power for sine-waves and a different optimum current for noise or music signals which can be better maintained, sine-waves having a lower peak to average than noise or music. In addition, the delay block 904 provides additional time for the current of the stationary coil signal to rise to target current of the stationary coil 518 particularly during fast transients.

The size of the delay employed by the delay block 904 may depend on the voltage available to drive the current of the stationary coil 518 as determined by the power electronics employed such as the power supply for the voltage source 724, the inductance and resistance of the stationary coil 518, the bandwidth of the arrangement 900 and therefore the slew rate of the transient being reproduced and secondary factors such as the amplifier headroom. In some cases, delay may not be required.

The adaptation block 184 utilizes the output of the conversion circuit 912 to determine the correct BL for the model based on the varying "B" (or magnetic flux) via equation 19. The adaptation block 184 provides the correct BL to the voltage transform block 186. The voltage transform block 186 generates V_corrected which is provided as an input to the moving coil 520 via the voltage source 808. The voltage transform block 186 generates V_corrected in response to the correct BL.

Figure 21:
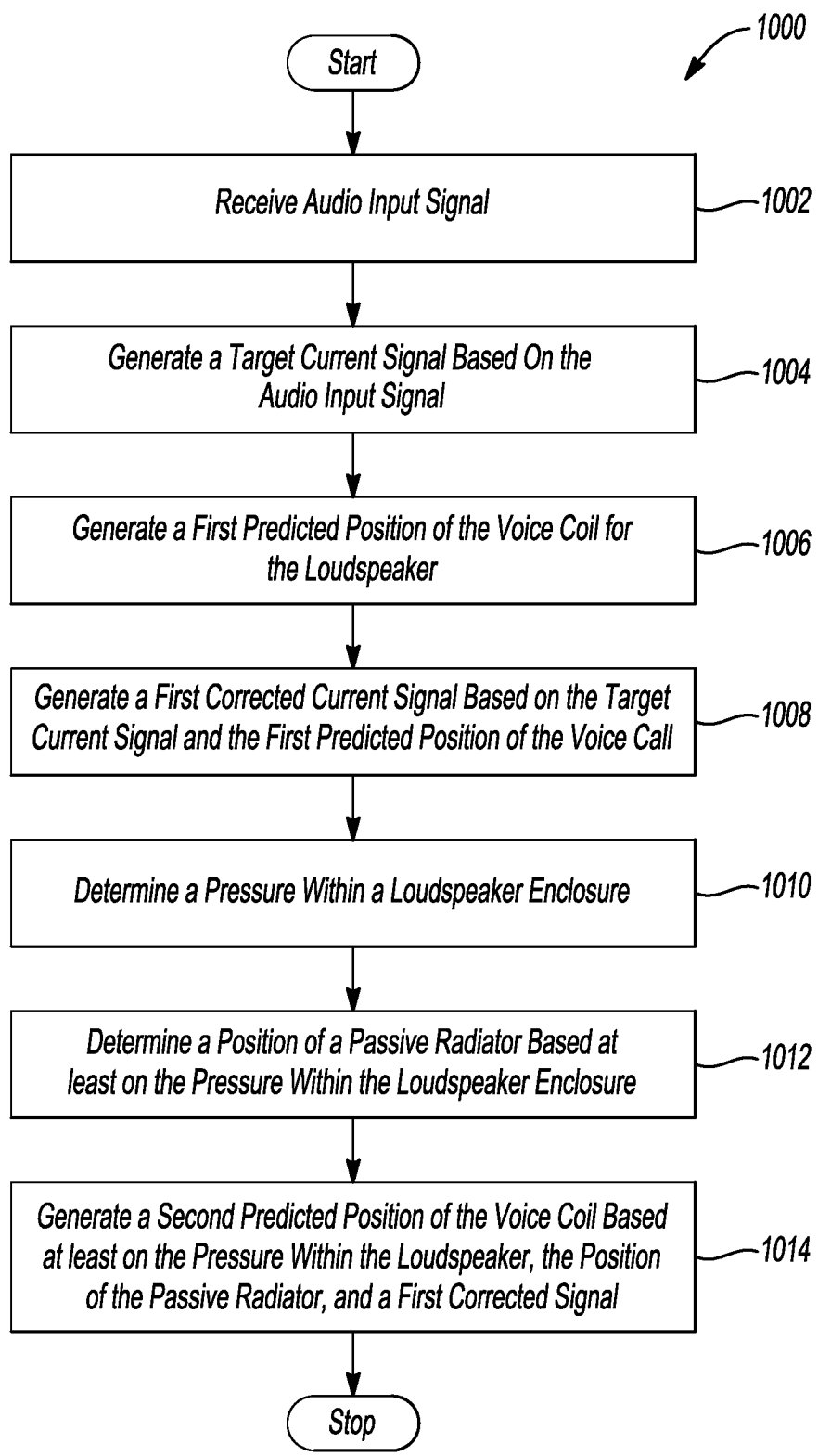
FIG. 21 generally depicts a method performed by the audio amplifier system in accordance to one embodiment.

FIG. 21 generally depicts a method 1000 performed by the audio amplifier system 150 in accordance to one embodiment.

In operation 1002, the audio amplifier system 150 receives an audio input signal. In operation 1004, the audio amplifier system 150 generates a target current signal based on the audio input signal. In operation 1006, the audio amplifier system 150 generates a first predicted position of the voice coil 112 for the loudspeaker 102. In operation 1008, the audio amplifier system 150 generates a first corrected current signal based on the target current signal and the first predicted position of the voice coil.

In operation 1010, the audio amplifier system 150 determines a pressure within the loudspeaker enclosure 101. In operation 1012, the audio amplifier system 150 determines a position of the passive radiator 104 based at least on the pressure within the loudspeaker enclosure 101. In operation 1014, the audio amplifier system 150 generates a second predicted position of the voice coil 112 based at least on the pressure within the loudspeaker 102, the position of the passive radiator 104, and a first corrected current signal.

Figure 22:
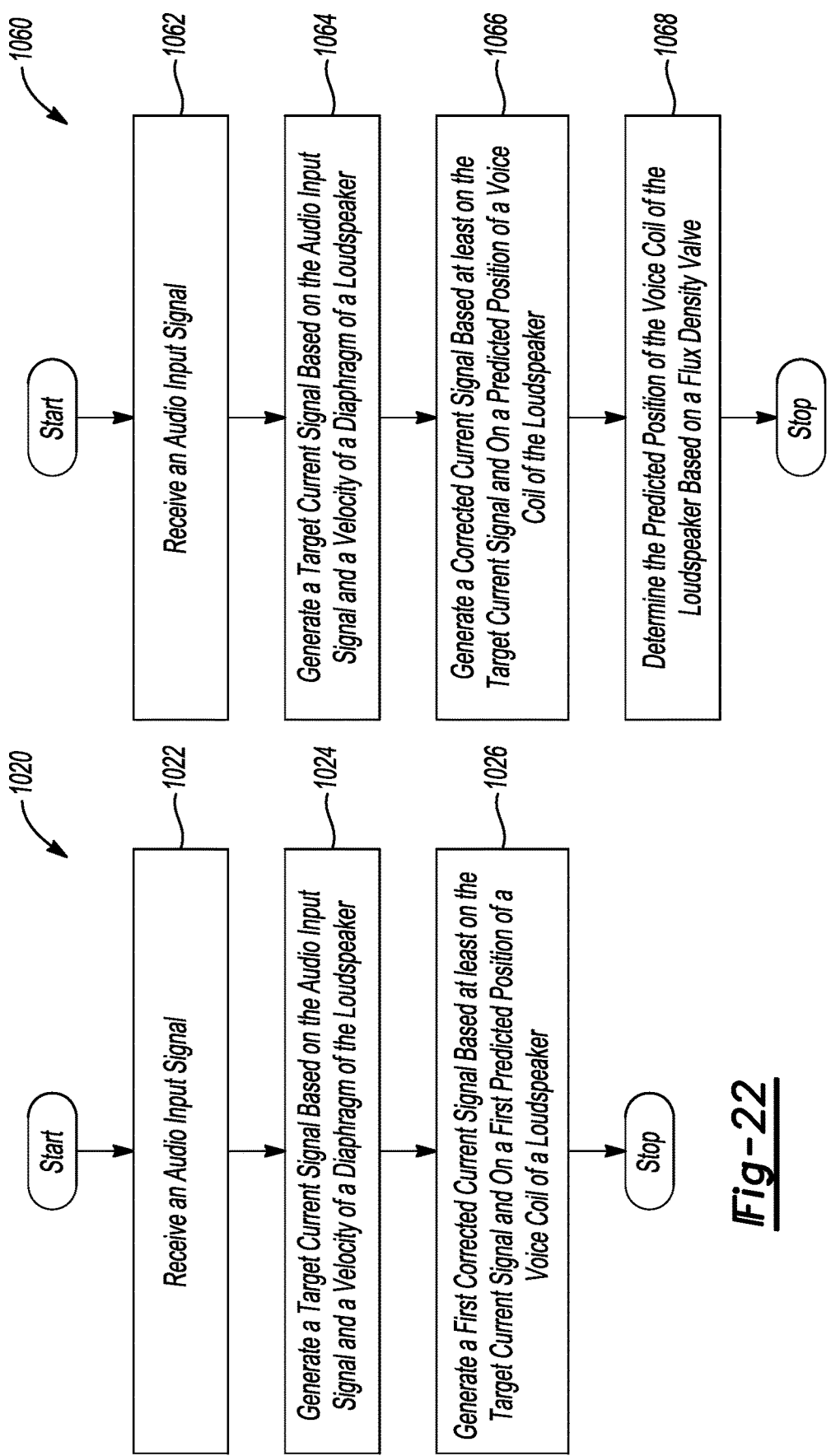
FIG. 22 generally depicts a method performed by the audio amplifier system in accordance to another embodiment.

FIG. 22 generally depicts a method 1020 performed by the audio amplifier system 180 in accordance to one embodiment.

In operation 1022, the audio amplifier system 180 generates a target current signal based on the audio input signal and a velocity of a diaphragm of the loudspeaker 102. In operation 1024, the audio amplifier system 180 generates a target current signal based on the audio input signal and a velocity of the diaphragm 110 of the loudspeaker 102. In operation 1026, the audio amplifier system 180 generates a first corrected current signal based at least one the target current signal and on a first predicted position of the voice coil 112 of the loudspeaker 102.

Figure 23:
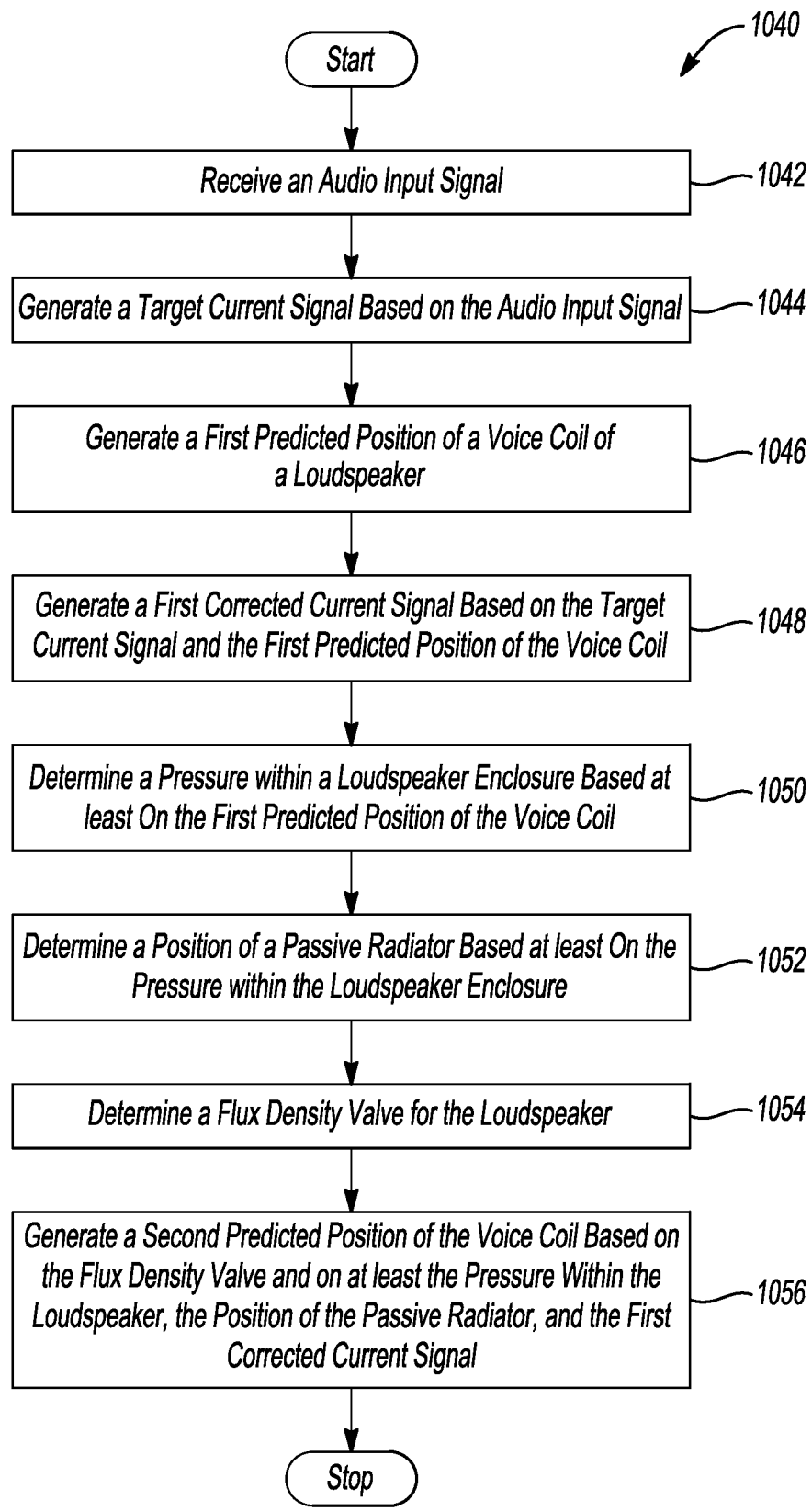
FIG. 23 generally depicts a method performed by the audio amplifier system in accordance to another embodiment.

FIG. 23 generally depicts a method 1040 performed by the audio amplifier system 500 in accordance to another embodiment.

In operation 1042, the audio amplifier system 500 receives an audio input signal. In operation 1044, the audio amplifier system 500 generates a target current signal based on the audio input signal. In operation 1046, the audio amplifier system generates a first predicted position of a voice coil 520 of the loudspeaker 102. In operation 1048, the audio amplifier system 500 determines a pressure within a loudspeaker enclosure 101 based on the first predicted position of the voice coil 112. In operation 1050, the audio amplifier system 500 determines a position of a passive radiator 104 based at least one the first predicted position of the voice coil 520. In operation 1052, the audio amplifier system 500 determines a flux density value for the loudspeaker 506. In operation 1054, the audio amplifier system 500 generates a position of the voice coil 520.

FIG. 24 generally depicts a method 1060 performed by any one of the audio amplifier systems 600, 700, 800, and 900.

In operation 1062, any one or more of the systems 600, 700, 800, and 900 generate an audio input signal. In operation 1064, any one or more of the systems 600, 700, 800, and 900 generate a target current signal based on the audio input signal and a velocity of the diaphragm 514 of the loudspeaker 506. In operation 1066, any one or more of the systems 600, 700, 800, and 900 generate a corrected current signal based at least on the target current signal and on a predicted position of the voice coil 520 of the loudspeaker 506. In operation 1064, any one or more of the systems 600, 700, 800, and 900 determine the predicted position of the voice coil 520 of the loudspeaker 506 based on a flux density value.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An audio amplifier system comprising:
    a memory; and
    an audio amplifier including the memory and being programmed to:
        receive an audio input signal;
        generate a target current signal based on the audio input signal;
        generate a first predicted position of a voice coil of a loudspeaker;
        generate a first corrected current signal based on the target current signal and the first predicted position of the voice coil;
        determine a pressure within a loudspeaker enclosure based at least on the first predicted position of the voice coil;
        determine a position of a passive radiator based at least on the pressure within the loudspeaker enclosure; and
        generate a second predicted position of the voice coil based on at least the pressure within the loudspeaker, the position of the passive radiator, and a first corrected current signal.

2. The system of claim 1, wherein the audio amplifier is further programmed to:
    generate a second corrected current signal based on the target current signal and the first predicted position of the voice coil; and
    transmit the second corrected current signal to the loudspeaker to control the position of the voice coil based on the second corrected current signal.

3. The system of claim 1, wherein the audio amplifier includes a conversion block programmed to store any number of generated predicted positions of the voice coil to provide a history of the generated predicted positions of the voice coil.

4. The system of claim 3, wherein the conversion block is further programmed to:
    generate an average spring model signal corresponding to a spring stiffness of the loudspeaker based on the history of the generated predicted positions of the voice coil; and
    generate an average damping model signal corresponding to a damping of the loudspeaker based on the history of the generated predicted positions of the voice coil.

5. The system of claim 4, wherein the spring stiffness of the loudspeaker corresponds to the spring stiffness of a surround and a spider of the loudspeaker.

6. The system of claim 4, wherein the damping of the loudspeaker corresponds to frictional losses of a surround and a spider of the loudspeaker.

7. The system of claim 4, wherein the audio amplifier includes:
a spring normalization block programmed to normalize the spring stiffness of the loudspeaker to a resting position that corresponds to the predicted position of the voice coil being set to zero; and
a damping normalization block programmed to normalize the damping of the loudspeaker to the resting position.

8. The system of claim 1 further comprising:
a first plurality of filters programmed to receive a first voice coil signal indicative of a measured voltage across the voice coil and to generate a first filter output based on the first voice coil signal;
a second plurality of filters programmed to receive a second voice coil signal indicative of a measure current across the voice coil and to generate a second filter output based on the second voice coil signal; and
a divider circuit programmed to generate an impedance signal indicative of an impedance of the voice coil based on the first filter output and the second filter output.

9. The system of claim 8 further comprising:
a first polynomial block programmed to determine a spring stiffness of the loudspeaker based on the impedance signal; and
a second polynomial block programmed to determine a damping of the loudspeaker based on the impedance signal.

10. An audio amplifier system comprising:
a memory and
an audio amplifier including the memory and being programmed to:
receive an audio input signal;
generate a target current signal based on the audio input signal and a velocity of a diaphragm of a transducer; and
generate a first corrected current signal based at least on the target current signal and on a first predicted position of a voice coil of a loudspeaker.

11. The system of claim 10, wherein the audio amplifier includes a first transform block programmed to convert a voltage corresponding to the audio input signal into the target current signal based on the audio input signal and on the velocity of the diaphragm of the transducer.

12. The system of claim 11, wherein the audio amplifier includes a second transform block programmed to convert the first corrected current signal into a first corrected voltage signal based on at least a predicted magnetic flux and the velocity of the diaphragm of the transducer.

13. The system of claim 12, wherein the second transform block is further programmed to convert the first corrected current signal into the first corrected voltage signal based on at least the predicted magnetic flux, the velocity of the diaphragm of the transducer and a back electromagnetic force (EMF) of the voice coil of the loudspeaker.

14. The system of claim 12, wherein the audio amplifier includes a conversion block programmed to store any number of generated predicted positions of the voice coil to provide a history of the generated predicted positions of the voice coil.

15. The system of claim 14, wherein the conversion block is further programmed to:

generate an average spring model signal corresponding to a spring stiffness of the loudspeaker based on the history of the generated predicted positions of the voice coil; and
generate an average damping model signal corresponding to a damping of the loudspeaker based on the history of the generated predicted positions of the voice coil.

16. The system of claim 15, wherein the audio amplifier includes:
a spring normalization block programmed to normalize the spring stiffness of the loudspeaker to a resting position that corresponds to the predicted position of the voice coil being set to zero; and
a damping normalization block programmed to normalize the damping of the loudspeaker to the resting position.

17. The system of claim 10 further comprising:
a first plurality of filters programmed to receive a first voice coil signal indicative of a measured voltage across the voice coil and to generate a first filter output based on the first voice coil signal;
a second plurality of filters programmed to receive a second voice coil signal indicative of a measure current across the voice coil and to generate a second filter output based on the second voice coil signal; and
a divider circuit programmed to generate an impedance signal indicative of an impedance of the voice coil based on the first filter output and the second filter output.

18. The system of claim 17 further comprising:
a first polynomial block programmed to determine a spring stiffness of the loudspeaker based on the impedance signal; and
a second polynomial block programmed to determine a damping of the loudspeaker based on the impedance signal.

19. A computer-program product embodied in a non-transitory computer read-able medium that is programmed for amplifying an audio input signal, the computer-program product comprising instructions for:
receiving the audio input signal;
generating a target current signal based on the audio input signal;
generating a first predicted position of a voice coil of a loudspeaker;
generating a first corrected current signal based on the target current signal and the first predicted position of the voice coil;
determining a pressure within a loudspeaker enclosure based at least on the first predicted position of the voice coil;
determining a position of a passive radiator based at least on the pressure within the loudspeaker enclosure; and
generating a second predicted position of the voice coil based on at least the pressure within the loudspeaker, the position of the passive radiator, and a first corrected current signal.

20. The computer-program product of claim 19 further comprising instructions for:
generating a second corrected current signal based on the target current signal and the first predicted position of the voice coil; and
transmitting the second corrected current signal to the loudspeaker to control the position of the voice coil based on the second corrected current signal.

* * * * *